(12) United States Patent
Nishikawa et al.

(10) Patent No.: US 9,941,297 B2
(45) Date of Patent: Apr. 10, 2018

(54) VERTICAL RESISTOR IN 3D MEMORY DEVICE WITH TWO-TIER STACK

(71) Applicant: SanDisk Technologies LLC, Plano, TX (US)

(72) Inventors: Masatoshi Nishikawa, Yokkaichi (JP); Kota Funayama, Kuwana (JP); Toru Miwa, Yokohama (JP); Hiroyuki Ogawa, Nagoya (JP)

(73) Assignee: SanDisk Technologies LLC, Plano, TX (US)

(*) Notice: Subject to any disclaimer, the term of this patent is extended or adjusted under 35 U.S.C. 154(b) by 0 days.

(21) Appl. No.: 15/607,837

(22) Filed: May 30, 2017

(65) Prior Publication Data

US 2017/0263642 A1 Sep. 14, 2017

Related U.S. Application Data

(62) Division of application No. 14/959,169, filed on Dec. 4, 2015, now Pat. No. 9,691,781.

(51) Int. Cl.
| | |
|---|---|
| *H01L 27/11582* | (2017.01) |
| *H01L 27/11556* | (2017.01) |
| *H01L 27/11524* | (2017.01) |
| *H01L 27/1157* | (2017.01) |

(52) U.S. Cl.
CPC .... *H01L 27/11582* (2013.01); *H01L 27/1157* (2013.01); *H01L 27/11524* (2013.01); *H01L 27/11556* (2013.01)

(58) Field of Classification Search
CPC ............. H01L 27/11551–27/11556; H01L 27/11578–27/11582
See application file for complete search history.

(56) References Cited

U.S. PATENT DOCUMENTS

| | | | |
|---|---|---|---|
| 4,912,540 A | 3/1990 | Sander et al. | |
| 8,461,639 B2 | 6/2013 | Jeong et al. | |
| 8,643,142 B2 | 2/2014 | Higashitani et al. | |
| 8,837,218 B2 | 9/2014 | Maejima | |
| 8,941,154 B2 | 1/2015 | Ahn | |
| 9,070,434 B2 | 6/2015 | Hioka et al. | |
| 2009/0230449 A1 | 9/2009 | Sakaguchi et al. | |
| 2010/0176440 A1 | 7/2010 | Omura | |
| 2010/0195395 A1 | 8/2010 | Jeong et al. | |
| 2011/0151667 A1 | 6/2011 | Hwang et al. | |

(Continued)

OTHER PUBLICATIONS

Invitation to Pay Additional Fees dated Dec. 9, 2016, International Application No. PCT/US2016/051451.

(Continued)

*Primary Examiner* — Tucker J Wright
(74) *Attorney, Agent, or Firm* — Vierra Magen Marcus LLP

(57) ABSTRACT

A vertical, columnar resistor in a semiconductor device is provided, along with techniques for fabricating such a resistor. The resistor may be provided in a peripheral area of a 3D memory device which has a two-tier or other multi-tier stack of memory cells. The structure and fabrication of the resistor can be integrated with the structure and fabrication of the stack of memory cells. The resistor may comprise doped polysilicon. In an example implementation, a polysilicon pillar extends a height of a first tier of the stack and a metal pillar above the polysilicon pillar extends a height of a second tier of the stack.

14 Claims, 28 Drawing Sheets

(56) References Cited

U.S. PATENT DOCUMENTS

| | | |
|---|---|---|
| 2011/0233652 A1 | 9/2011 | Shino et al. |
| 2012/0061744 A1 | 3/2012 | Hwang et al. |
| 2013/0065386 A1 | 3/2013 | Kim et al. |
| 2013/0242667 A1 | 9/2013 | Shim et al. |
| 2013/0308363 A1 | 11/2013 | Scheuerlein et al. |
| 2015/0255386 A1 | 9/2015 | Lee et al. |

OTHER PUBLICATIONS

International Search Report & The Written Opinion of the International Searching Authority dated Jan. 31, 2017, International Application No. PCT/US2016/051451.
Restriction Requirement dated Oct. 20, 2016, U.S. Appl. No. 14/959,169, filed Dec. 4, 2015.
Response to Restriction Requirement dated Dec. 1, 2016, U.S. Appl. No. 14/959,169, filed Dec. 4, 2015.
Non-final Office Action dated Dec. 29, 2016, U.S. Appl. No. 14/959,169, filed Dec. 4, 2015.
Response to Office Action dated Mar. 8, 2017, U.S. Appl. No. 14/959,169, filed Dec. 4, 2015.
Notice of Allowance dated Apr. 10, 2017, U.S. Appl. No. 14/959,169, filed Dec. 4, 2015.
U.S. Appl. No. 14/959,169, filed Dec. 4, 2015 by Nishikawa et al.
Written Opinion of the International Searching Authority (Separate Sheet) dated Jan. 27, 2017, International Application No. PCT/US2016/051451.

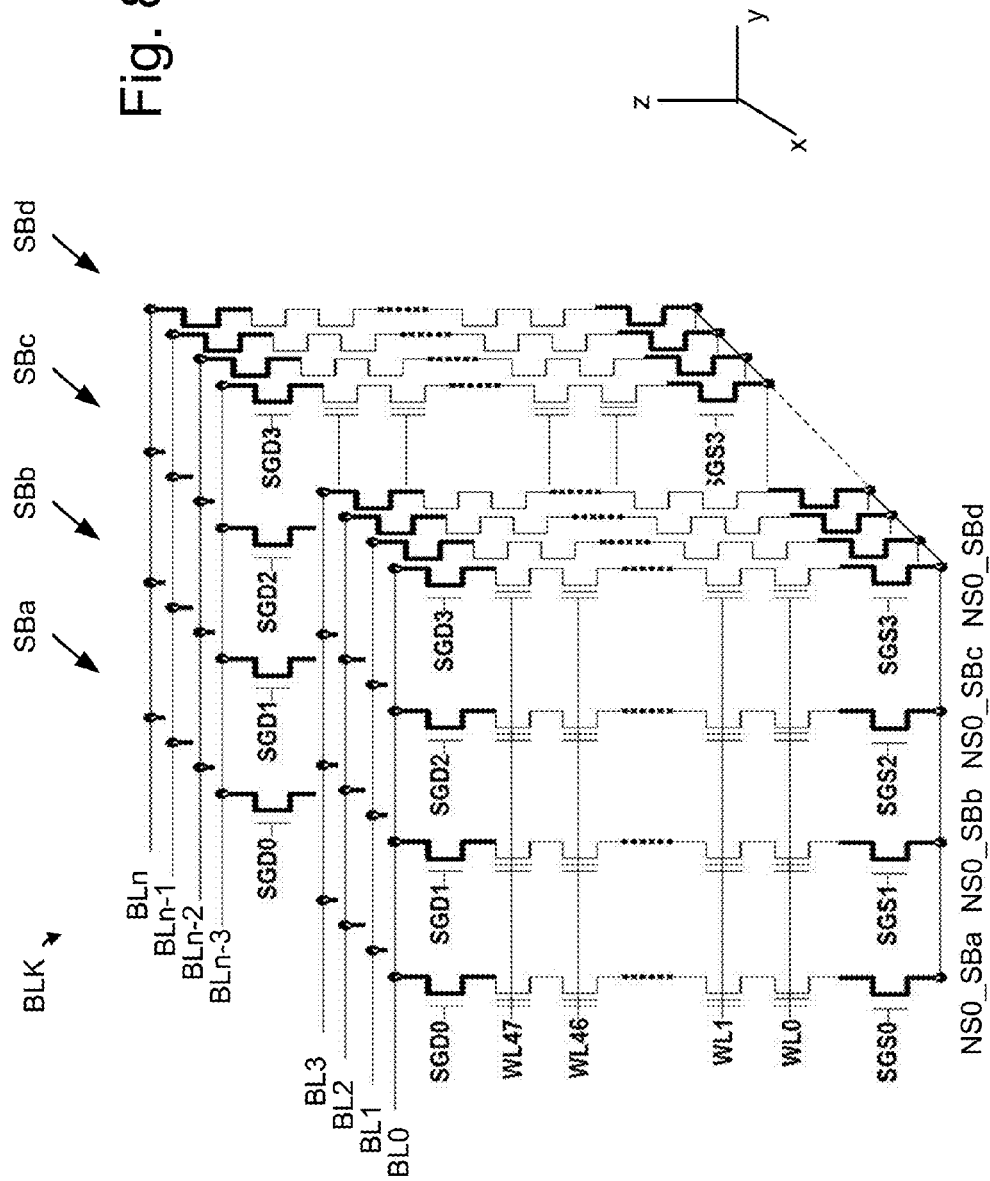

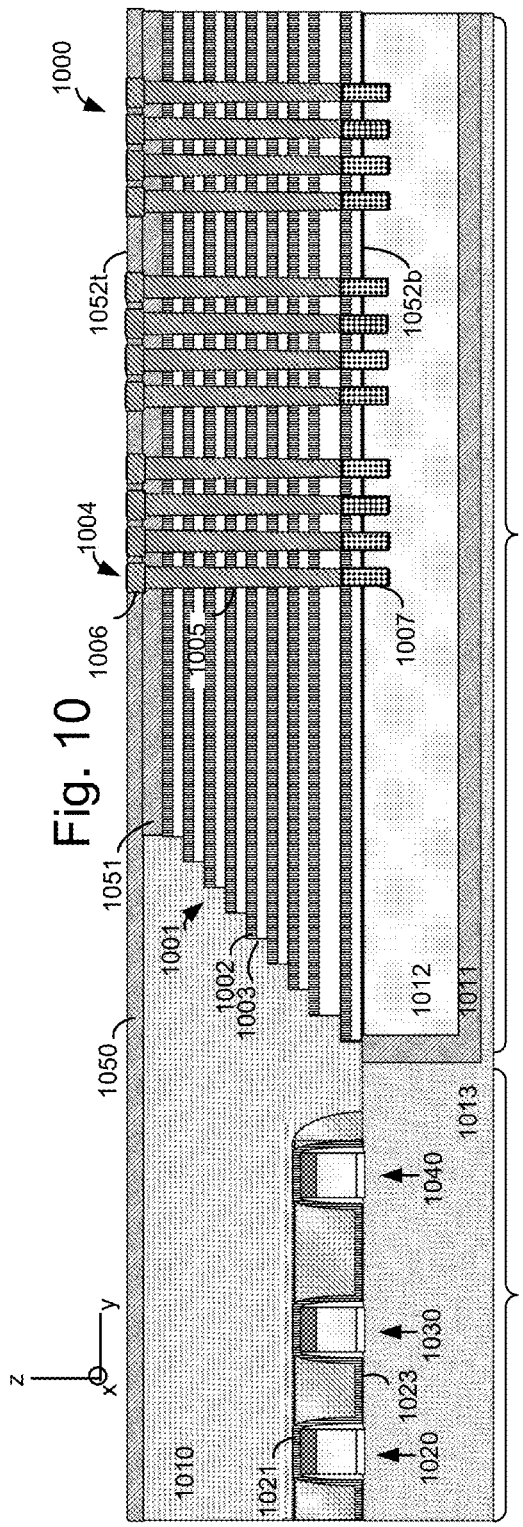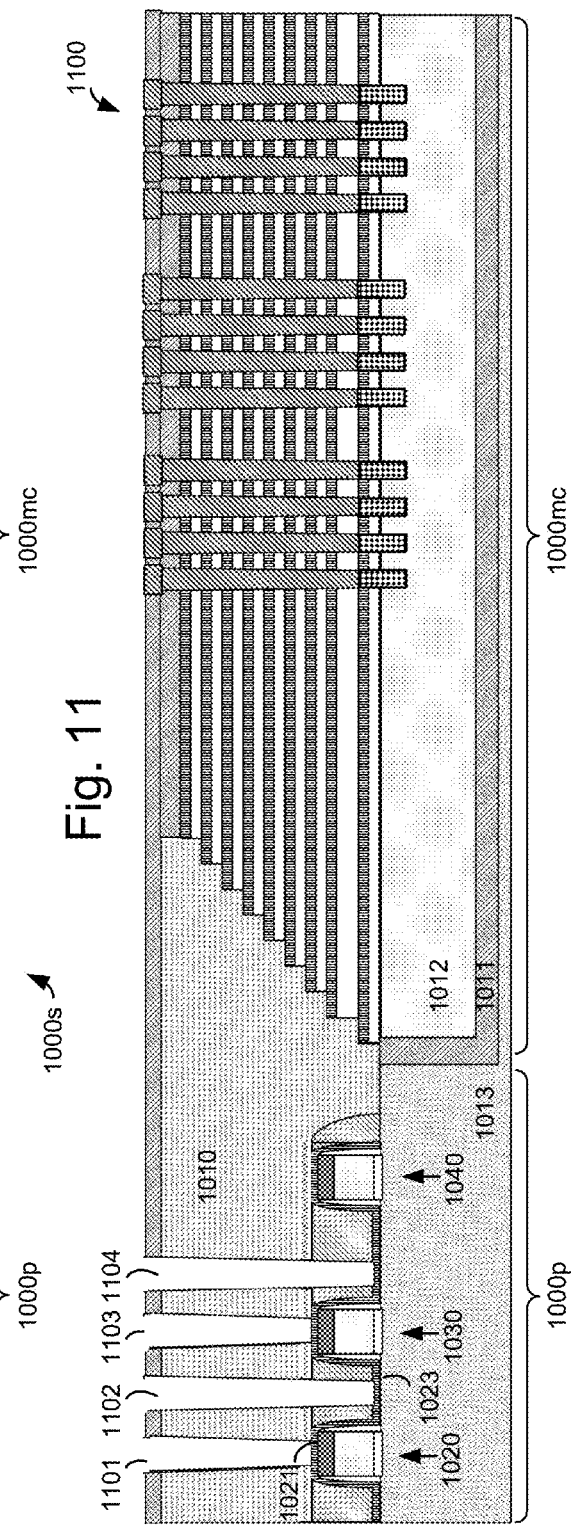

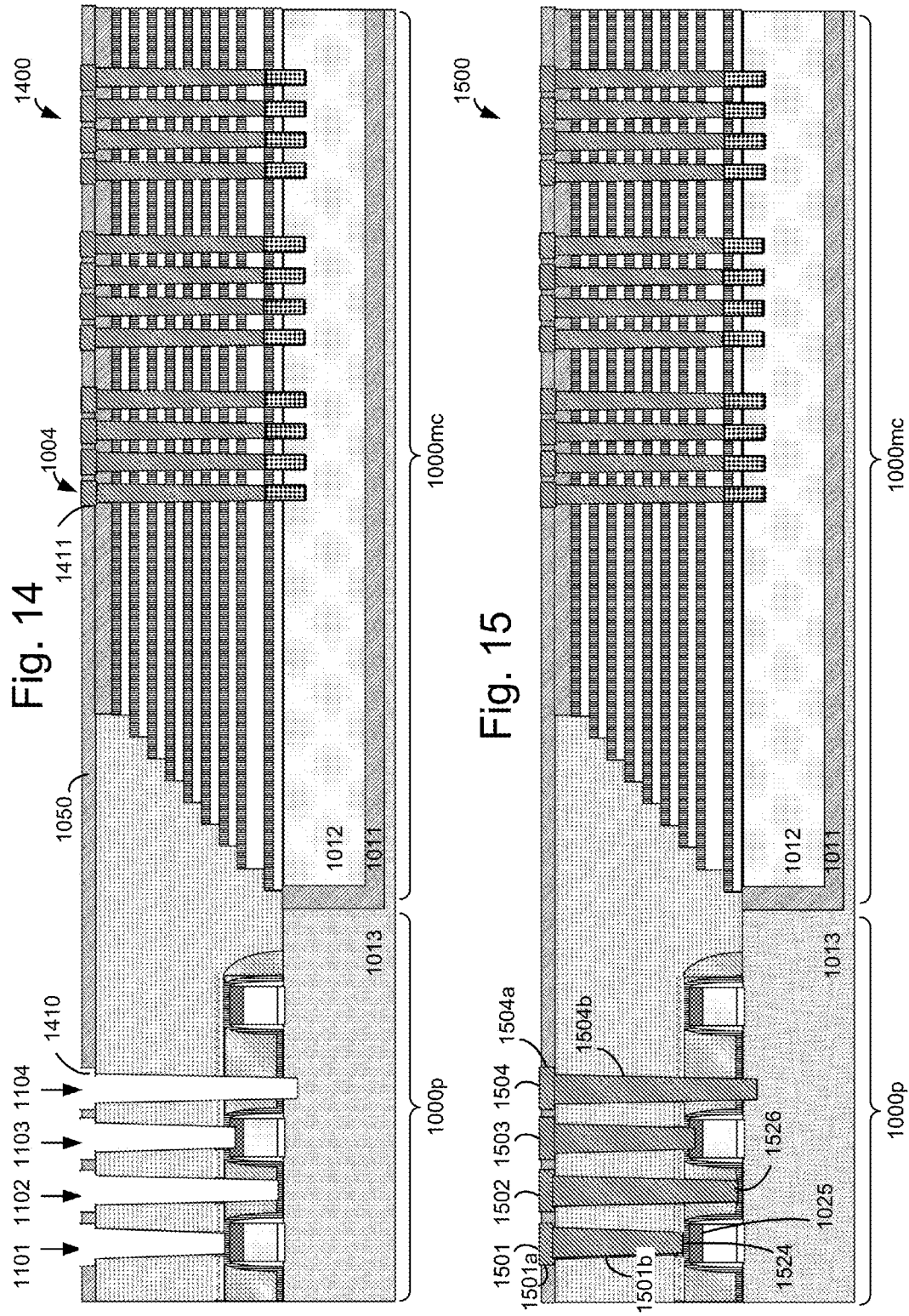

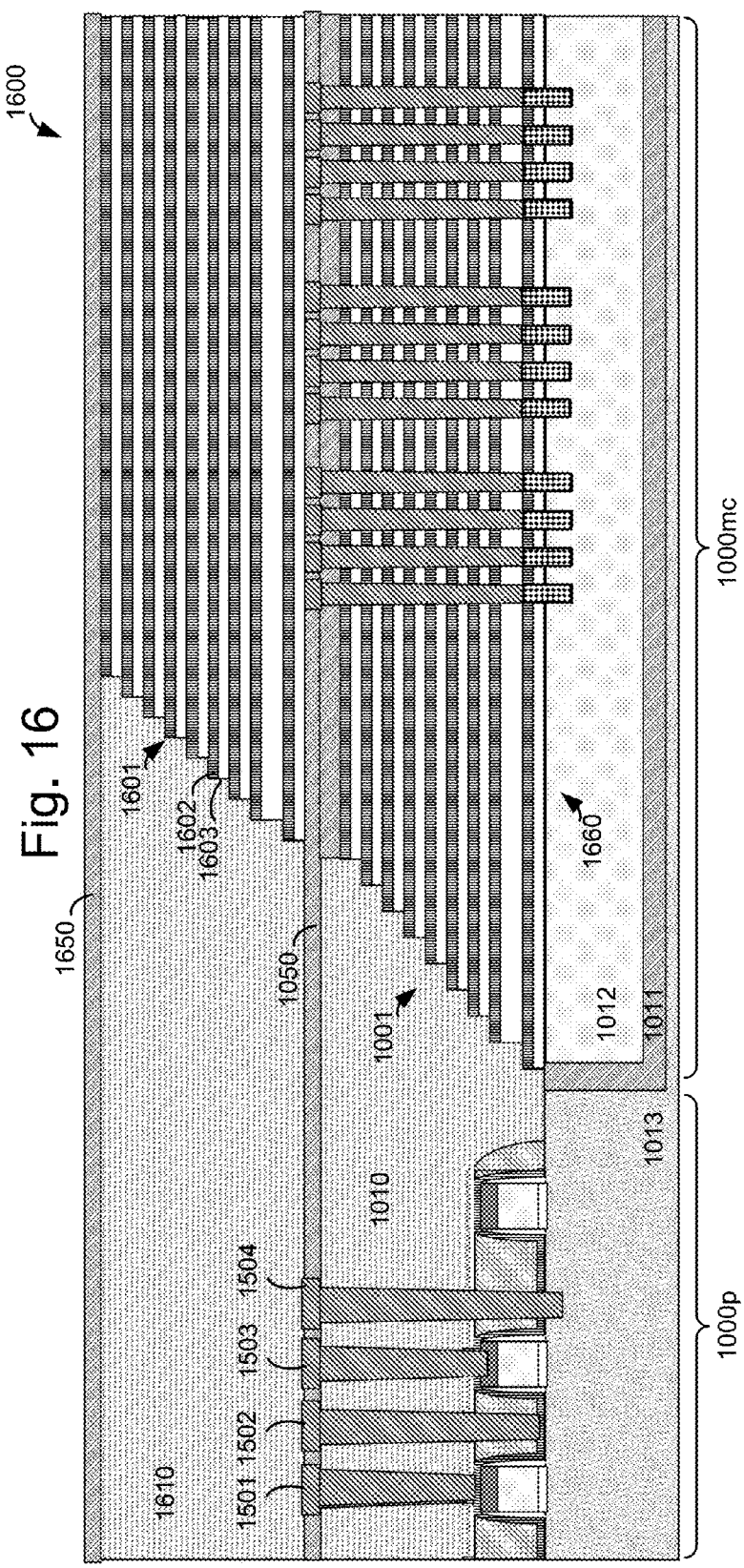

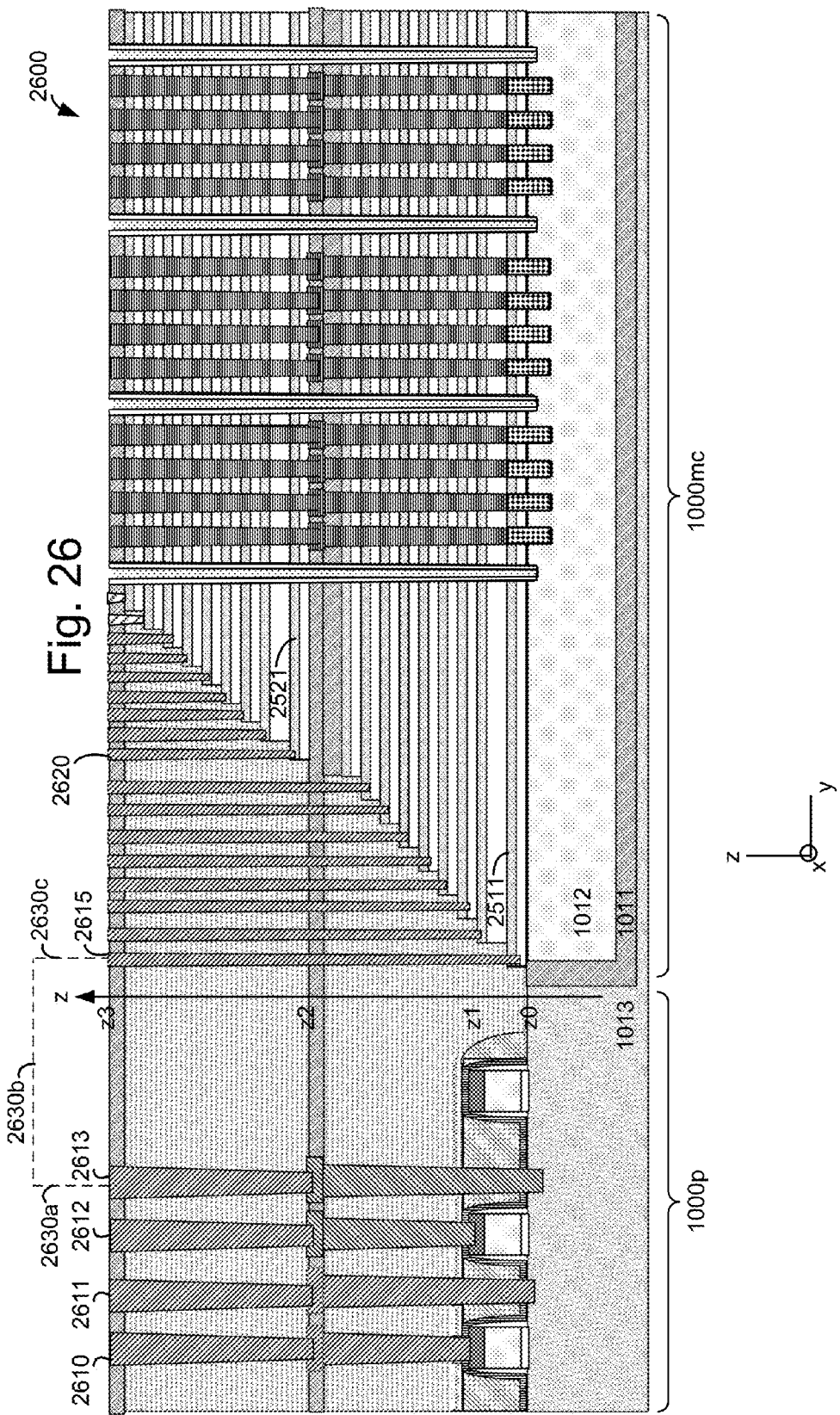

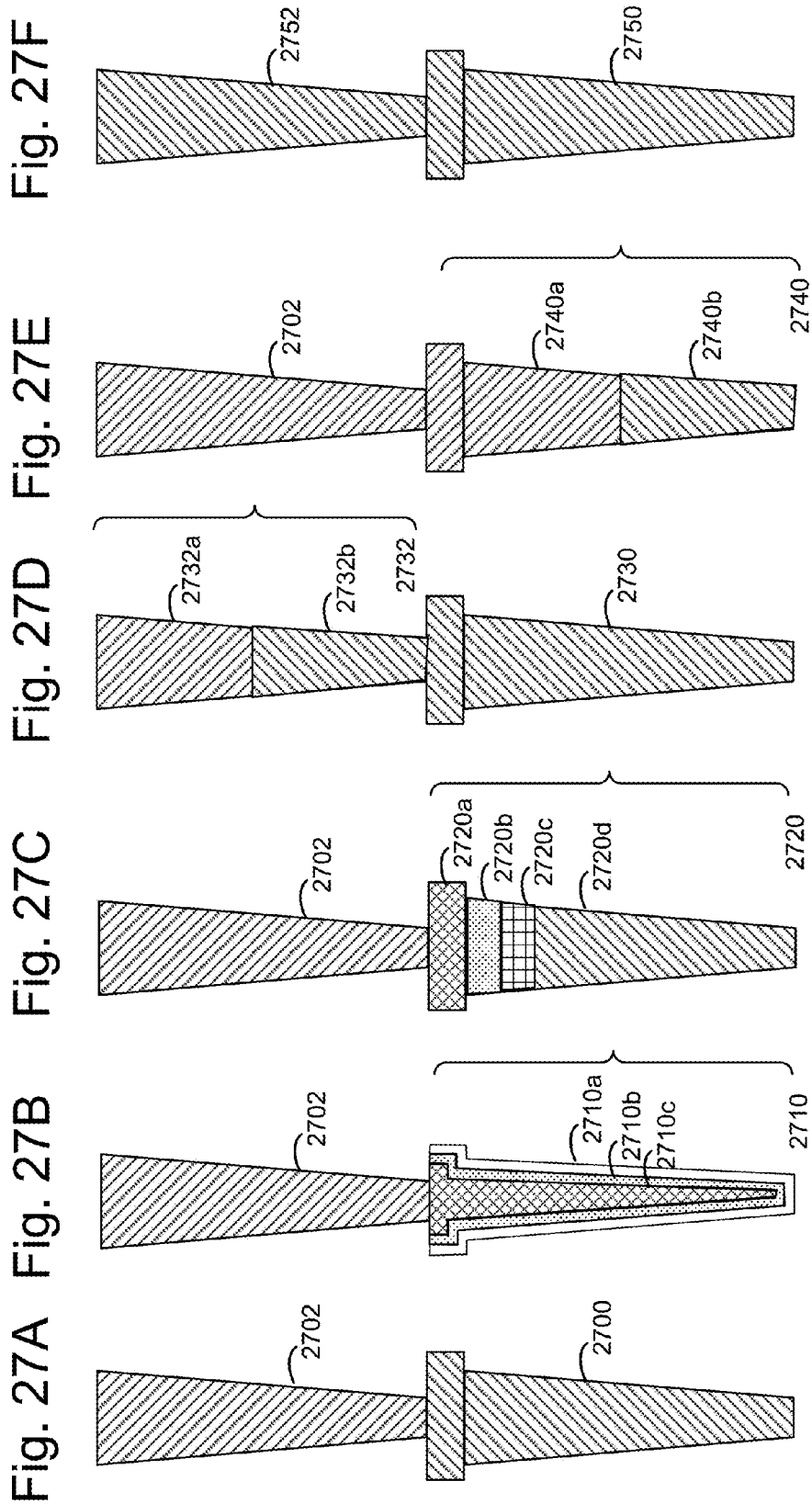

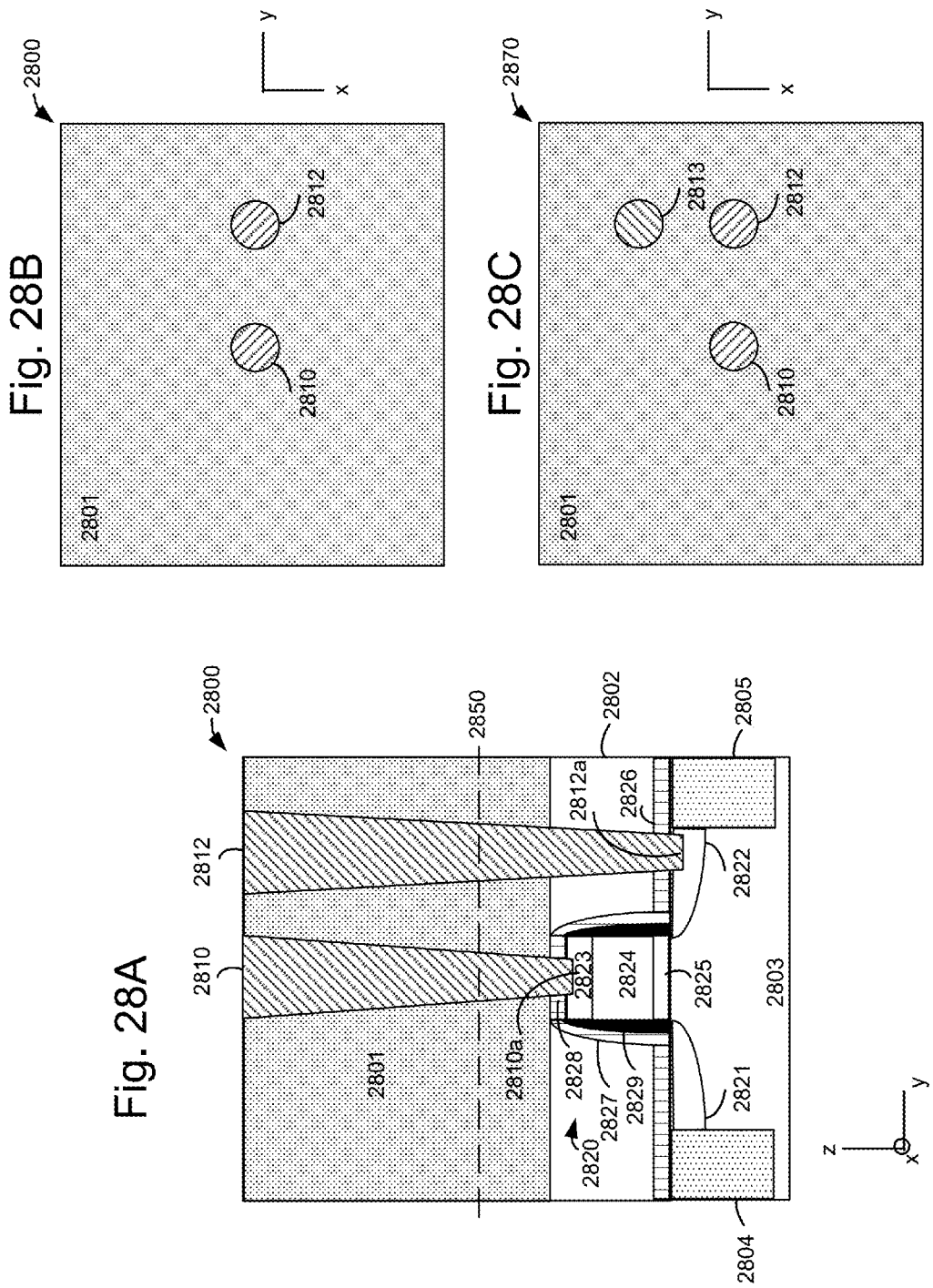

VERTICAL RESISTOR IN 3D MEMORY DEVICE WITH TWO-TIER STACK

CLAIM OF PRIORITY

This application is a divisional application of U.S. patent application Ser. No. 14/959,169, entitled "VERTICAL RESISTOR IN 3D MEMORY DEVICE WITH TWO-TIER STACK," filed Dec. 4, 2015, published as US 2017/0162592A1 on Jun. 8, 2017 and issued as U.S. Pat. No. 9,691,781 on Jun. 27, 2017, and incorporated herein by reference in its entirety.

BACKGROUND

The present technology relates to semiconductor memory devices.

Semiconductor memory devices are used in various electronic devices. For example, non-volatile semiconductor memory is used in cellular telephones, digital cameras, personal digital assistants, mobile computing devices, non-mobile computing devices and other devices.

A charge-storing material such as a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in strings, for instance, select gate transistors are provided at the ends of the string to selectively connect a channel of the string to a source line or bit line. However, various challenges are presented in providing such memory devices.

BRIEF DESCRIPTION OF THE DRAWINGS

FIG. 8B depicts another example view of NAND strings in sub-blocks.

FIG. 10 depicts a semiconductor structure in a configuration which is consistent with step 910 and 911 of FIG. 9B.

FIG. 11 depicts a semiconductor structure in a configuration which is consistent with step 912 of FIG. 9B.

FIG. 14 depicts a semiconductor structure in a configuration which is consistent with step 915 of FIG. 9B.

FIG. 15 depicts a semiconductor structure in a configuration which is consistent with step 916 of FIG. 9B.

FIG. 16 depicts a semiconductor structure in a configuration which is consistent with step 917 of FIG. 9B.

FIG. 26 depicts a semiconductor structure in a configuration which is consistent with step 928 of FIG. 9B.

FIG. 27A depicts an example of a column which includes a columnar polysilicon resistor below a columnar metal contact.

FIG. 27B depicts an example of a columnar polysilicon resistor with regions with different dopant concentrations, below a columnar metal contact.

FIG. 27C depicts an example of a columnar polysilicon resistor with dopants implanted at different dopant concentrations, below a columnar metal contact.

FIG. 27D depicts an example of a first column comprising a polysilicon resistor below a second column, where a bottom portion of the second column comprises polysilicon and a top portion of the second column comprises metal.

FIG. 27E depicts an example of a first column below a second column, where a bottom portion of the first column comprises polysilicon, a top portion of the first column comprises metal, and the second column comprises metal.

FIG. 27F depicts an example of a first column below a second column, where the first column and the second column both comprise polysilicon.

FIG. 28A depicts an example transistor in the peripheral region of FIG. 11 in which columnar resistors are connected to terminals of the transistor.

FIG. 28B depicts an example cross-sectional view along line 2850 in FIG. 28A, where one columnar resistor is connected to one terminal of the transistor and another columnar resistor is connected to another terminal of the transistor.

FIG. 28C depicts another example cross-sectional view along line 2850 in FIG. 28A, where one columnar resistor is connected to one terminal of the transistor and two columnar resistors are connected to another terminal of the transistor.

DETAILED DESCRIPTION

Figure 1:
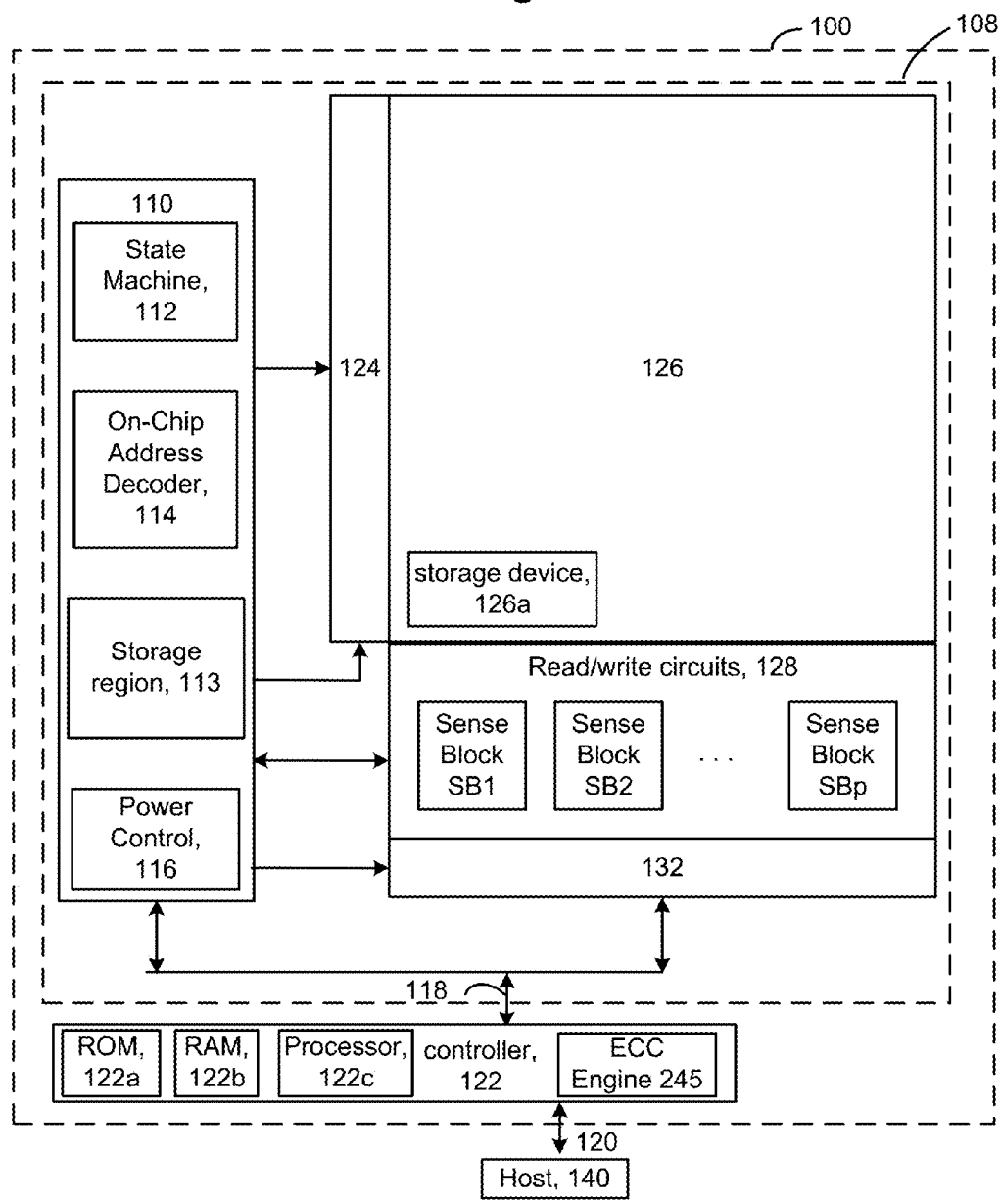
FIG. 1 is a block diagram of an example memory device.

A vertical, columnar resistor in a semiconductor device is provided, along with techniques for fabricating such a resistor. The resistor may be provided in a peripheral area of a 3D memory device which has a two-tier or other multi-tier stack of memory cells. The structure and fabrication of the resistor can be integrated with the structure and fabrication of the stack of memory cells.

A 3D memory structure may comprise a stack formed from an array of alternating conductive and dielectric layers. A memory hole is etched in the layers to define many memory layers simultaneously. A NAND string is then formed by filling the memory hole with appropriate materials. For example, a MONOS film stack can be used. This include a metal which forms the control gate layer in the stack, as well as a film stack of oxide-nitride-oxide (ONO) followed by polysilicon (polycrystalline silicon) which are provided along the sidewall of each memory hole. A 3D memory structure can have various configurations. For example, a straight NAND string extends in one memory hole, while a pipe- or U-shaped NAND string (P-BiCS) includes a pair of vertical columns of memory cells which extend in two memory holes and which are joined by a bottom back gate.

In some memory devices, the memory cells are joined to one another such as in NAND strings in a block or sub-block. Each NAND string comprises a number of memory cells connected in series between one or more drain-side select gate transistors (SGD transistors), on a drain-side of the NAND string which is connected to a bit line, and one or more source-side select gate transistors (SGS transistors), on a source-side of the NAND string which is connected to a source line. Further, the memory cells can be arranged with a common word line) which acts a control gate. The control gates of the memory cells and select gate transistors can be provided by the conductive layers in the stack.

The stack of memory cells is provided in a memory cell area of a substrate while circuits for controlling the memory cells are provided in a peripheral area of the substrate, peripheral to the memory cell area. Such circuits can include generators which provide control gate voltages, reference voltages and reference currents, a power on circuit, and a digital-to-analog converter in a charge pump. Such circuits may be used during programming, reading and erasing operations for the memory cells. However, various challenges are presented in fabricating such circuits. For example, resistors are used in the circuits. One configuration of resistors includes a resistive material which extends across the surface of the substrate in multiple rows. However, such a configuration consumes a significant area of the substrate.

Techniques provided herein address the above and other issues by providing columnar resistors. In an example implementation, multiple columns, e.g., pillars, are created in a peripheral area of a substrate, with one column for each tier of a multi-tiered stack of memory cells. In one approach, a first column comprises polysilicon which forms a resistor, and a second column above the first column comprises metal as a contact to the resistor. The first and second columns together form a conductive path from a terminal of a transistor on the substrate to a top of the stack. A via may continue the conductive path to above-stack metal layers. The resistance of the resistor can be set by controlling a dopant level in the polysilicon. In one example approach, in-situ doping is performed during the deposition of amorphous silicon. One example of in-situ doping involves depositing multiple layers of silicon, where a different dopant concentration is provided for each layer. In one example, one layer or region is undoped, or intrinsic. In another example approach, dopants can be provided using ion implantation in the amorphous silicon. The amorphous silicon is converted to polysilicon by a heating step.

The columnar resistors may be fabricated in concert with a multi-tiered stack of memory cells, without significant changes to the lithographic process. For example, in a two-tiered stack, the first column may extend to a height of a top of the first tier, and the second column may extend from a height of the bottom of the second tier, or the height of the top of the first tier, to a height of a top of the second tier. Thus, the first column may be fabricated in concert with the first tier of the stack, and the second column may be fabricated in concert with the second tier of the stack. In general, a number N>=2 of tiers may be provided for the stack, with corresponding columns in the peripheral region, where each column is co-extensive with one of the tiers.

In another example implementation, multiple columnar resistors are connected to one metal contact. In another example, one part of a column comprises polysilicon and another part of the column comprises metal. In another example, a column comprising polysilicon is positioned above another column comprising polysilicon. Various other implementations are possible.

Various other features and benefits are described below. FIG. 1-8B describes a general configuration of a 3D memory device. FIGS. 9A and 9B are flowcharts for a fabrication process. FIG. 10A-29D depict example semiconductor structures.

FIG. 1 is a block diagram of an example memory device. The memory device 100 may include one or more memory die 108. The memory die 108 includes a memory structure 126 of memory cells, such as an array of memory cells, control circuitry 110, and read/write circuits 128. The array may be a three-dimensional array of NAND strings, for example. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided, e.g., for programming and read parameters.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform various operations such as read, write and erase. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

Figure 2:
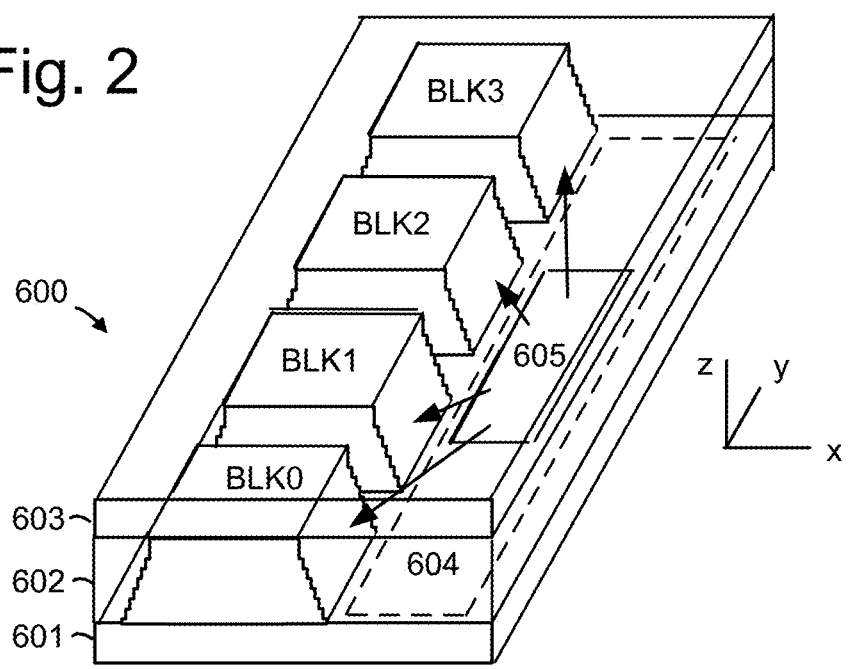
FIG. 2 is a perspective view of a memory device 600 comprising a set of blocks in an example three-dimensional configuration of the memory array 126 of FIG. 1.

FIG. 2 is a perspective view of a memory device 600 comprising a set of blocks in an example three-dimensional configuration of the memory array 126 of FIG. 1. On the substrate are example blocks BLK0, BLK1, BLK2 and BLK3 of memory cells (storage elements) and a peripheral area 604 with circuitry for use by the blocks. For example, the circuitry can include voltage drivers 605 which can be connected to control gate layers of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Additional examples of the peripheral area of a memory device are described further below.

Figure 3:
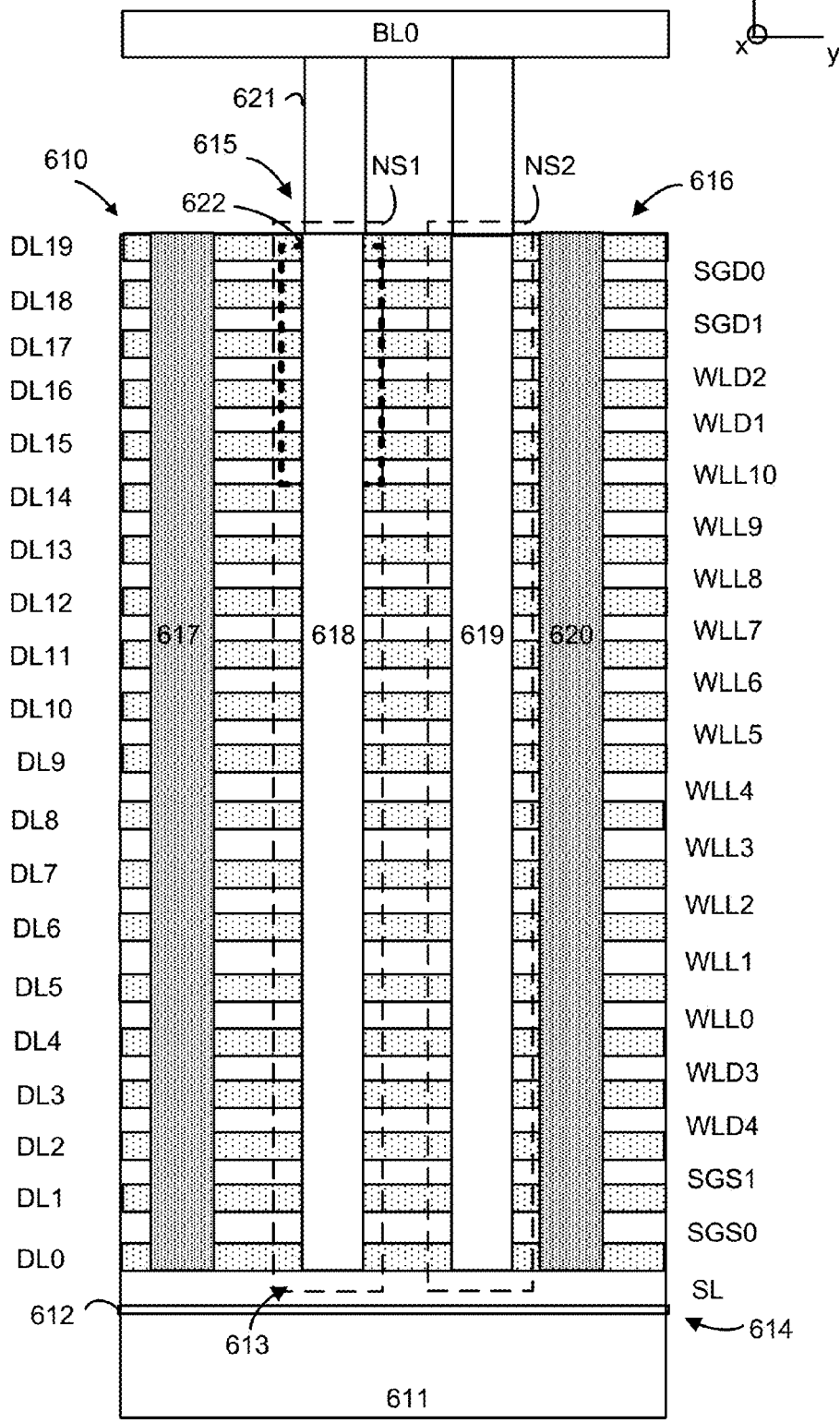
FIG. 3 depicts an example cross-sectional view of a portion of one of the blocks of FIG. 2.

FIG. 3 depicts an example cross-sectional view of a portion of one of the blocks of FIG. 2. The block comprises a stack 610 of alternating conductive and dielectric layers. In this example, the conductive layers comprise two SGD layers, two SGS layers and four dummy word line layers WLD1, WLD2, WLD3 and WLD4, in addition to data word line layers (word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 5.

The stack includes a substrate 611, an insulating film 612 on the substrate, and a portion of a source line SL. NS1 has a source-end 613 at a bottom 614 of the stack and a drain-end 615 at a top 616 of the stack. Metal-filled slits 617 and 620 may be provided periodically across the stack as interconnects which extend through the stack, such as to connect the source line to a line above the stack. The slits may be used during the formation of the word lines and subsequently filled with metal or doped polysilicon. The slits may also be used to access the control gate layers to replace a scarified material with metal and to access the back side of materials in the memory holes, in some cases. A portion of a bit line BL0 is also depicted. A conductive via 621 connects the drain-end 615 to BL0.

Figure 4A:
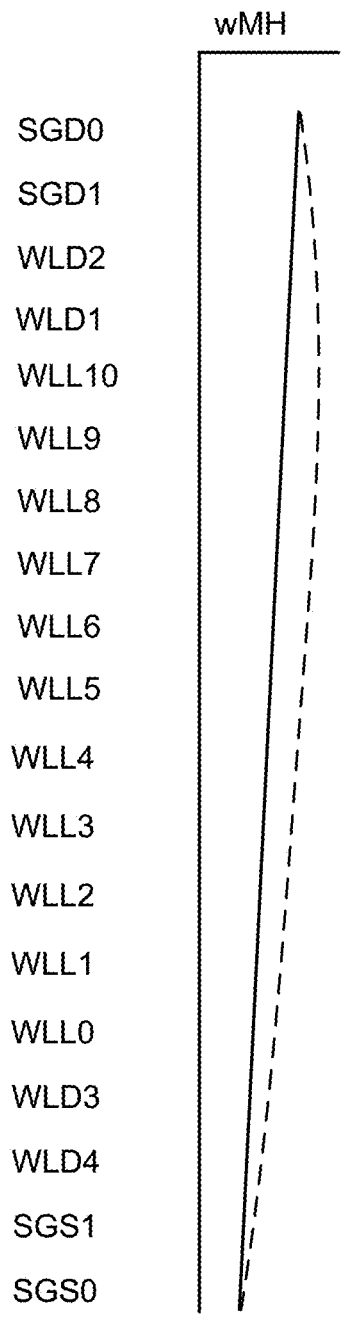
FIG. 4A depicts a plot of memory hole diameter in the stack of FIG. 3.

FIG. 4A depicts a plot of memory hole diameter in the stack of FIG. 3. The vertical axis is aligned with the stack of FIG. 3 and depicts a width (wMH), e.g., diameter, of the memory holes 618 and 619. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole (solid line). That is, the memory holes are tapered, narrowing at the bottom of the stack. In some cases, in a bowed profile, a slight narrowing occurs at the top of the hole near the select gate so that the diameter becomes slight wider before becoming progressively smaller from the top to the bottom of the memory hole (long dashed line). For example, the memory hole width is a maximum at the level of WL9 in the stack. The memory hole width is slightly smaller at the level of WL10, and progressively smaller at the levels of WL8 to WL0.

Due to the non-uniformity in the width of the memory hole, the programming and erase speed of the memory cells can vary based on their position along the memory hole, e.g., based on their height in the stack. With a smaller diameter memory hole, the electric field across the tunnel oxide is relatively stronger, so that the programming and erase speed is relatively higher.

Figure 4B:
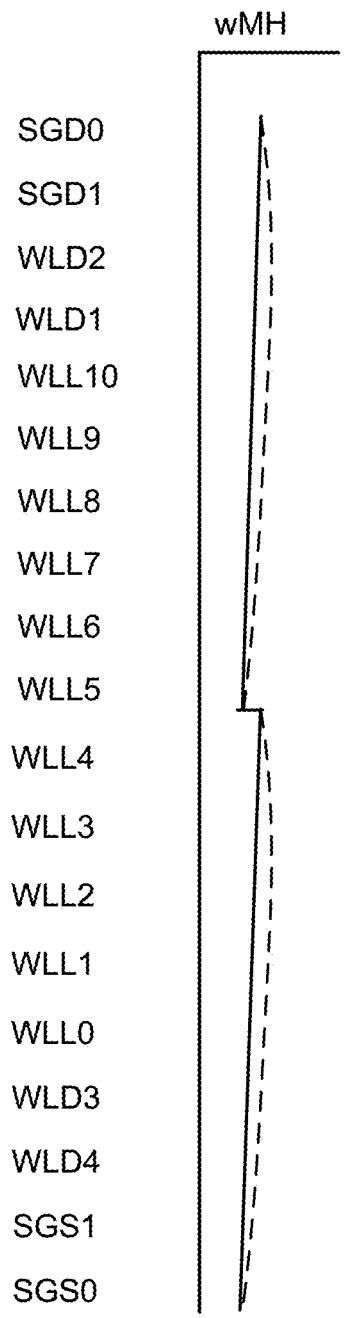
FIG. 4B depicts a plot of memory hole diameter in a two-tier stack.

FIG. 4B depicts a plot of memory hole diameter in a two-tier stack. In another possible implementation, the stack is fabricated in two (or more) tiers. A first, bottom tier is formed first with a respective memory hole. A second, top tier is then formed with a respective memory hole which is aligned with the memory hole in the bottom tier. Each portion of the memory hole is tapered such that a double tapered memory hole is formed in which the width increases, then decreases and increases again, moving from the bottom of the stack to the top, as represented by the solid line. Or, each portion may have a bowed profile, as represented by the dashed line.

Figure 5:
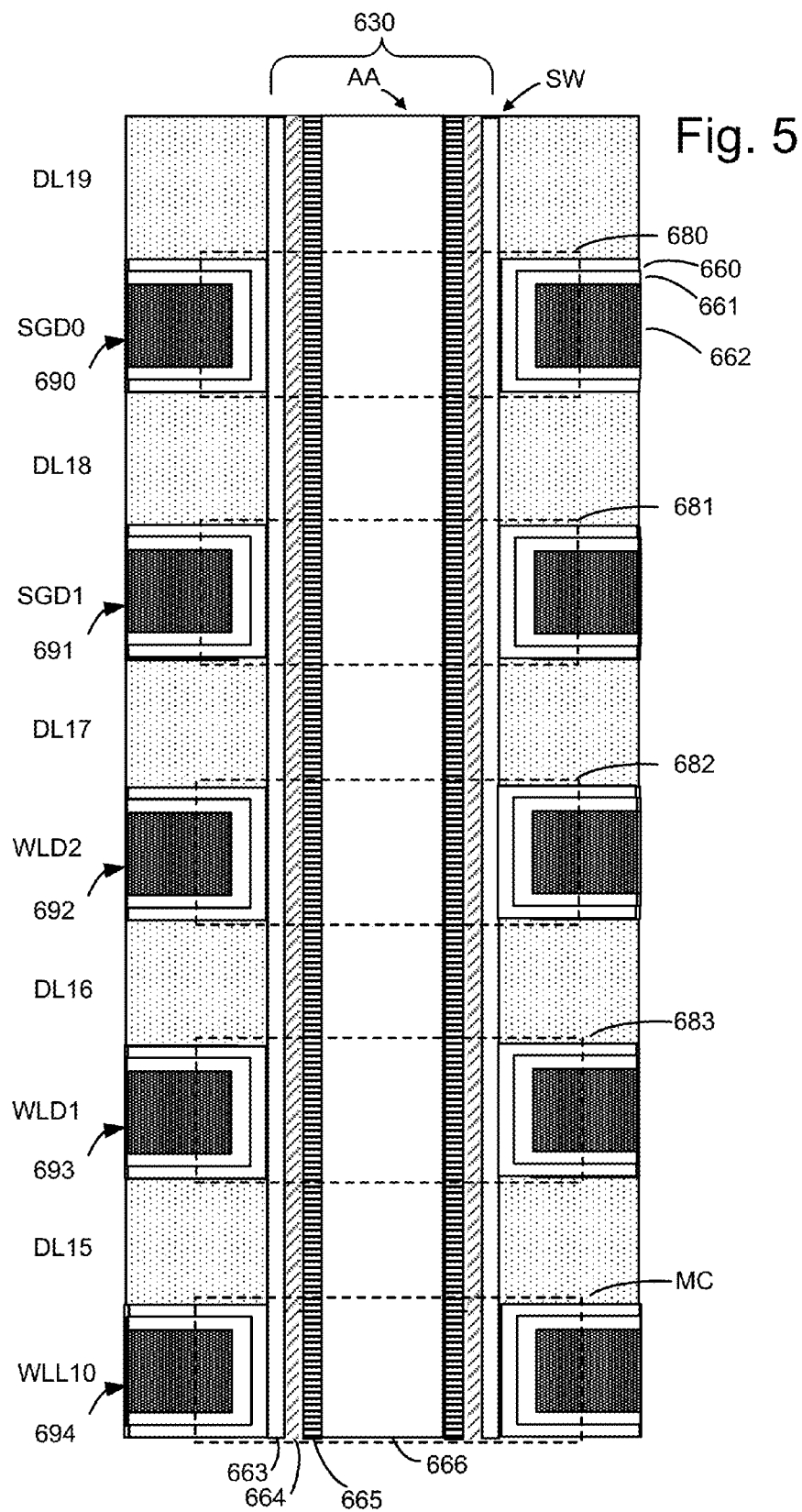
FIG. 5 depicts a close-up view of the region 622 of the stack of FIG. 3.

FIG. 5 depicts a close-up view of the region 622 of the stack of FIG. 3. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 6:
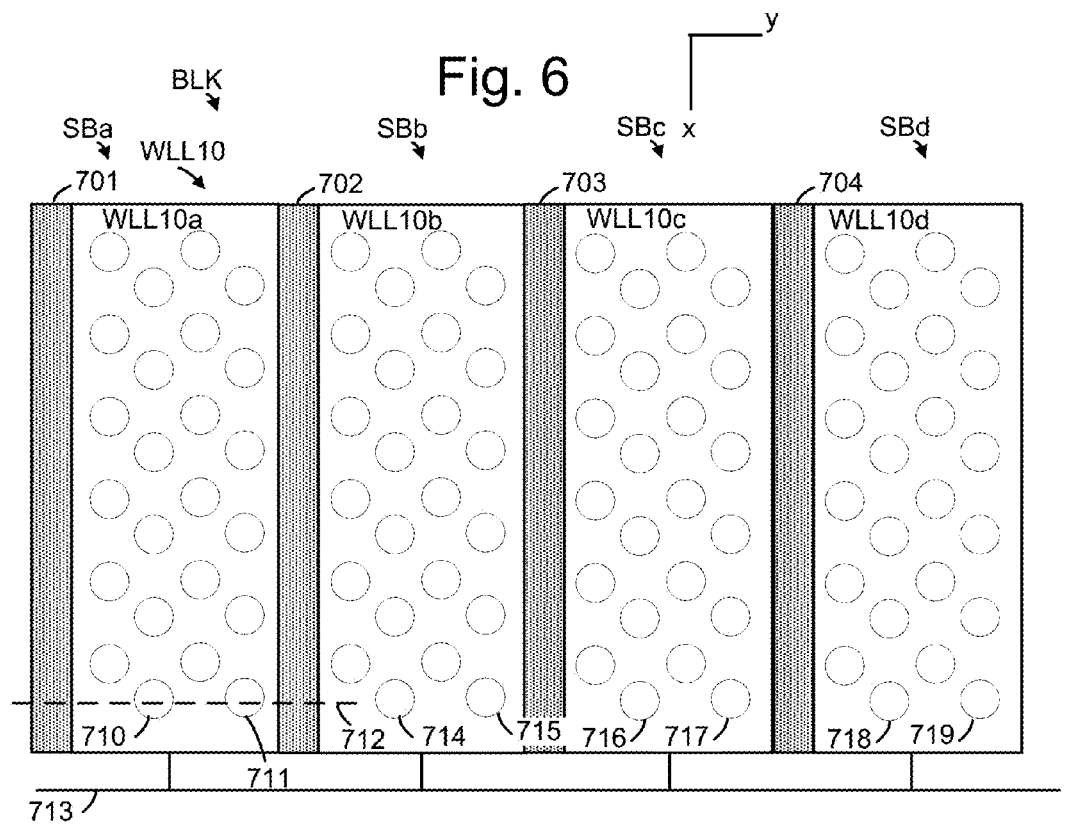
FIG. 6 depicts a top view of an example word line layer WLL10 of the stack of FIG. 3.

FIG. 6 depicts a top view of an example word line layer WLL10 of the stack of FIG. 3. As mentioned, a 3D memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a 3D memory device can be divided into sub-blocks, where each sub-block comprises a set of NAND string which have a common SGD control line. Further, a word line layer in a block can be divided into regions. Each region can extend between slits which are formed periodically in the stack to process the word line layers during the fabrication process of the memory device. This processing can include replacing a sacrificial material of the word line layers with metal. Generally, the distance between slits should be relatively small to account for a limit in the distance that an etchant can travel laterally to remove the sacrificial material, and that the metal can travel to fill a void which is created by the removal of the sacrificial material. For example, the distance between slits may allow for a few rows of memory holes between adjacent slits. The layout of the memory holes and slits should also account for a limit in the number of bit lines which can extend across the region while each bit line is connected to a different memory cell. After processing the word line layers, the slits can optionally be filed with metal to provide an interconnect through the stack.

This figures and other are not necessarily to scale. In practice, the regions can be much longer in the x-direction relative to the y-direction than is depicted to accommodate additional memory holes.

In this example, there are four rows of memory holes between adjacent slits. A row here is a group of memory holes which are aligned in the x-direction. Moreover, the rows of memory holes are in a staggered pattern to increase the density of the memory holes. The word line layer is divided into regions WLL10a, WLL10b, WLL10c and WLL10d which are each connected by a connector 713. The last region of a word line layer in a block can be connected to a first region of a word line layer in a next block, in one approach. The connector, in turn, is connected to a voltage driver for the word line layer. The region WLL10a has example memory holes 710 and 711 along a line 712. See also FIGS. 7 and 8. The region WLL10b has example memory holes 714 and 715. The region WLL10c has example memory holes 716 and 717. The region WLL10d has example memory holes 718 and 719. Each memory hole can be part of a respective NAND string. For example, the memory holes 710, 714, 716 and 718 can be part of NAND strings NS0_SBa, NS0_SBb, NS0_SBc and NS0_SBd, respectively.

Each circle represents the cross-section of a memory hole at a word line layer or SG layer. Each circle can alternatively represent a memory cell which is provided by the materials in the memory hole and by the adjacent word line layer.

Metal-filled slits 701, 702, 703 and 704 (e.g., metal interconnects) may be located between and adjacent to the edges of the regions WLL10a-WLL10d. The metal-filled slits provide a conductive path from the bottom of the stack to the top of the stack. For example, a source line at the bottom of the stack may be connected to a conductive line above the stack, where the conductive line is connected to a voltage driver in a peripheral region of the memory device. See also FIG. 8A for further details of the sub-blocks SBa-SBd of FIG. 6.

Figure 7:
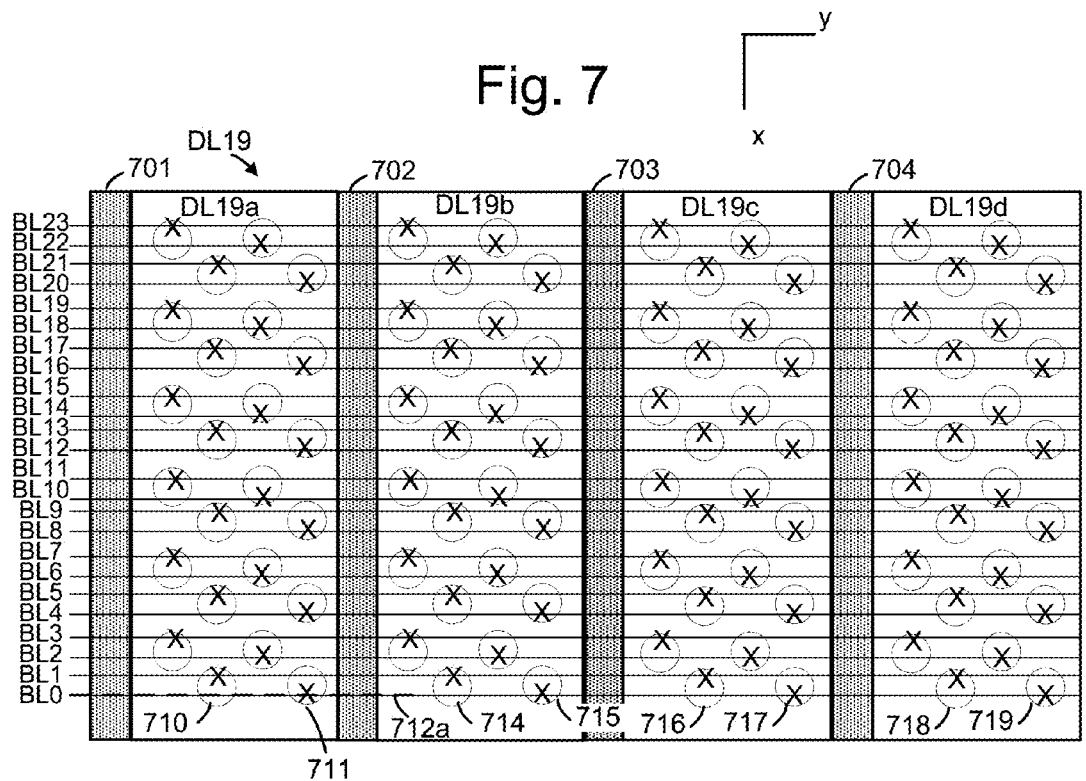
FIG. 7 depicts a top view of an example top dielectric layer DL19 of the stack of FIG. 3.

FIG. 7 depicts a top view of an example top dielectric layer DL19 of the stack of FIG. 3. The dielectric layer is divided into regions DL19a, DL19b, DL19c and DL19d. Each region can be connected to a respective voltage driver. This allows a set of memory cells in one region of a word line layer to be programmed concurrently, with each memory cell being in a respective NAND string which is connected to a respective bit line. A voltage can be set on each bit line to allow or inhibit programming during each program voltage.

The region DL19a has the example memory holes 710 and 711 along a line 712a which is coincident with a bit line BL0. A number of bit lines extend above the memory holes and are connected to the memory holes as indicated by the "X" symbols. BL0 is connected to a set of memory holes which includes the memory holes 711, 715, 717 and 719. Another example bit line BL1 is connected to a set of memory holes which includes the memory holes 710, 714, 716 and 718. The metal-filled slits 701, 702, 703 and 704 from FIG. 6 are also depicted, as they extend vertically through the stack. The bit lines can be numbered in a sequence BL0-BL23 across the DL19 layer in the -x direction.

Different subsets of bit lines are connected to cells in different rows. For example, BL0, BL4, BL8, BL12, BL16 and BL20 are connected to cells in a first row of cells at the right hand edge of each region. BL2, BL6, BL10, BL14, BL18 and BL22 are connected to cells in an adjacent row of cells, adjacent to the first row at the right hand edge. BL3, BL7, BL11, BL15, BL19 and BL23 are connected to cells in a first row of cells at the left hand edge of each region. BL1, BL5, BL9, BL13, BL17 and BL21 are connected to cells in an adjacent row of cells, adjacent to the first row at the left hand edge.

Figure 8A:
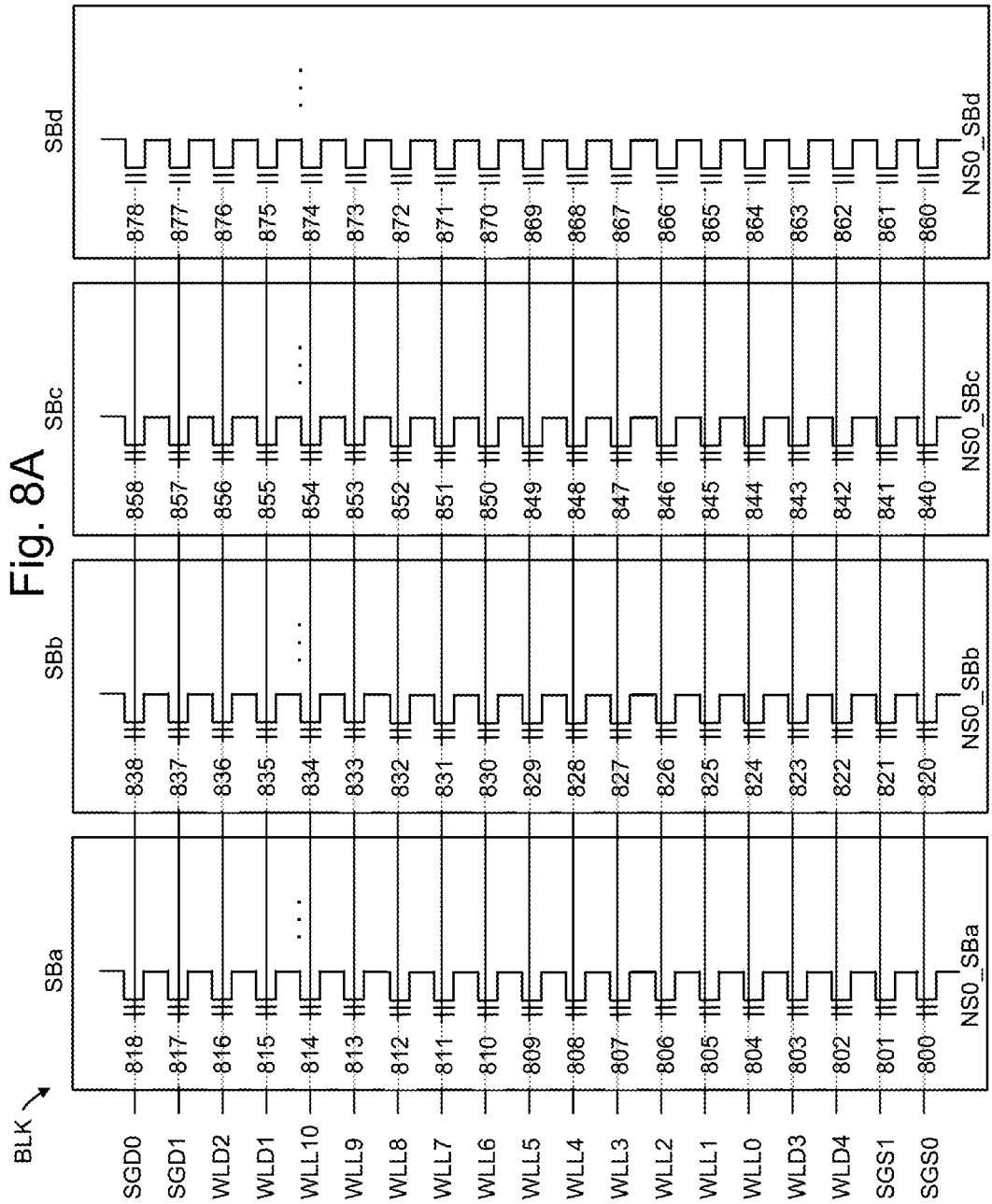
FIG. 8A depicts example NAND strings in the sub-blocks SBa-SBd of FIG. 7A.
Figure 9A:
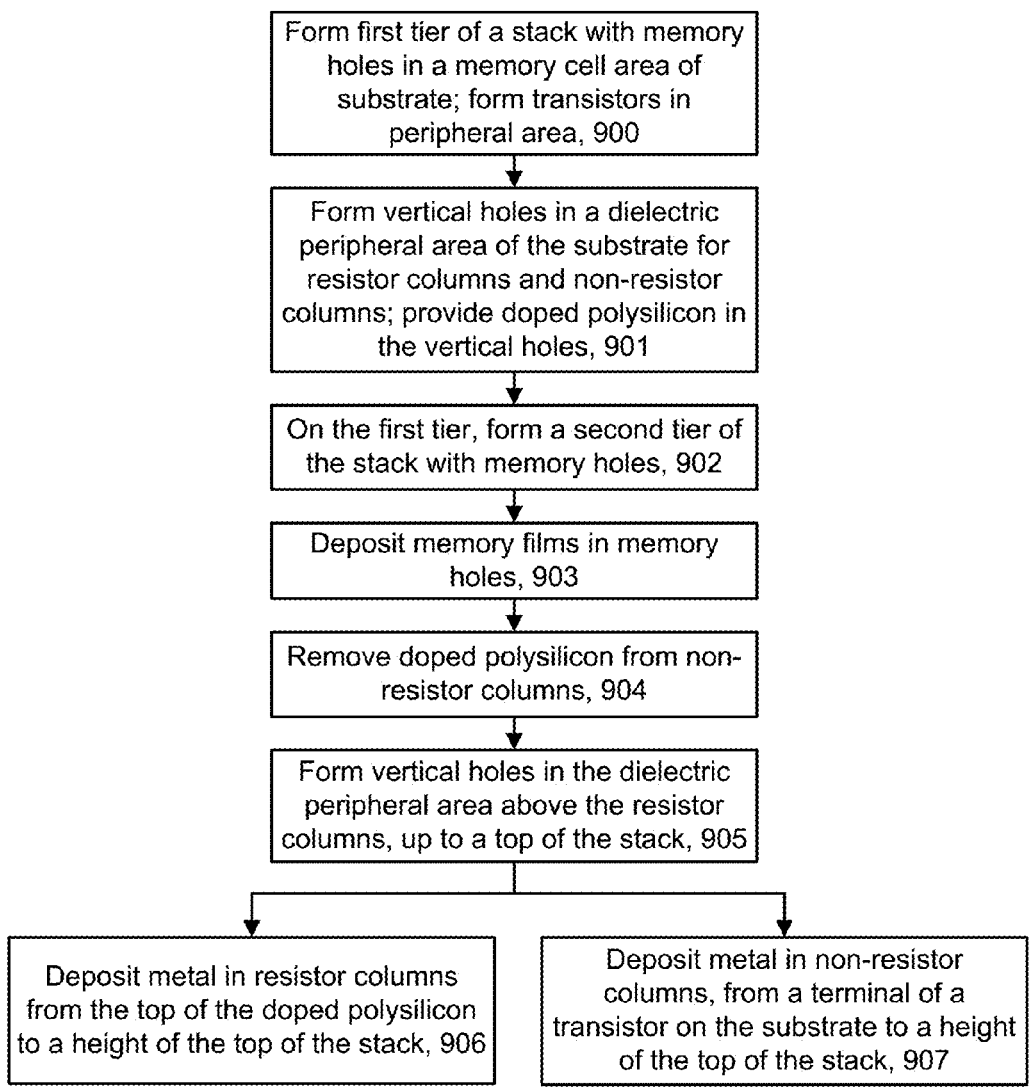
FIG. 9A depicts an overview of an example fabrication process for a semiconductor structure which includes a multi-tiered stack of memory cells in a memory cell area of a substrate and a columnar resistor in a peripheral area of the substrate.
Figure 9B:
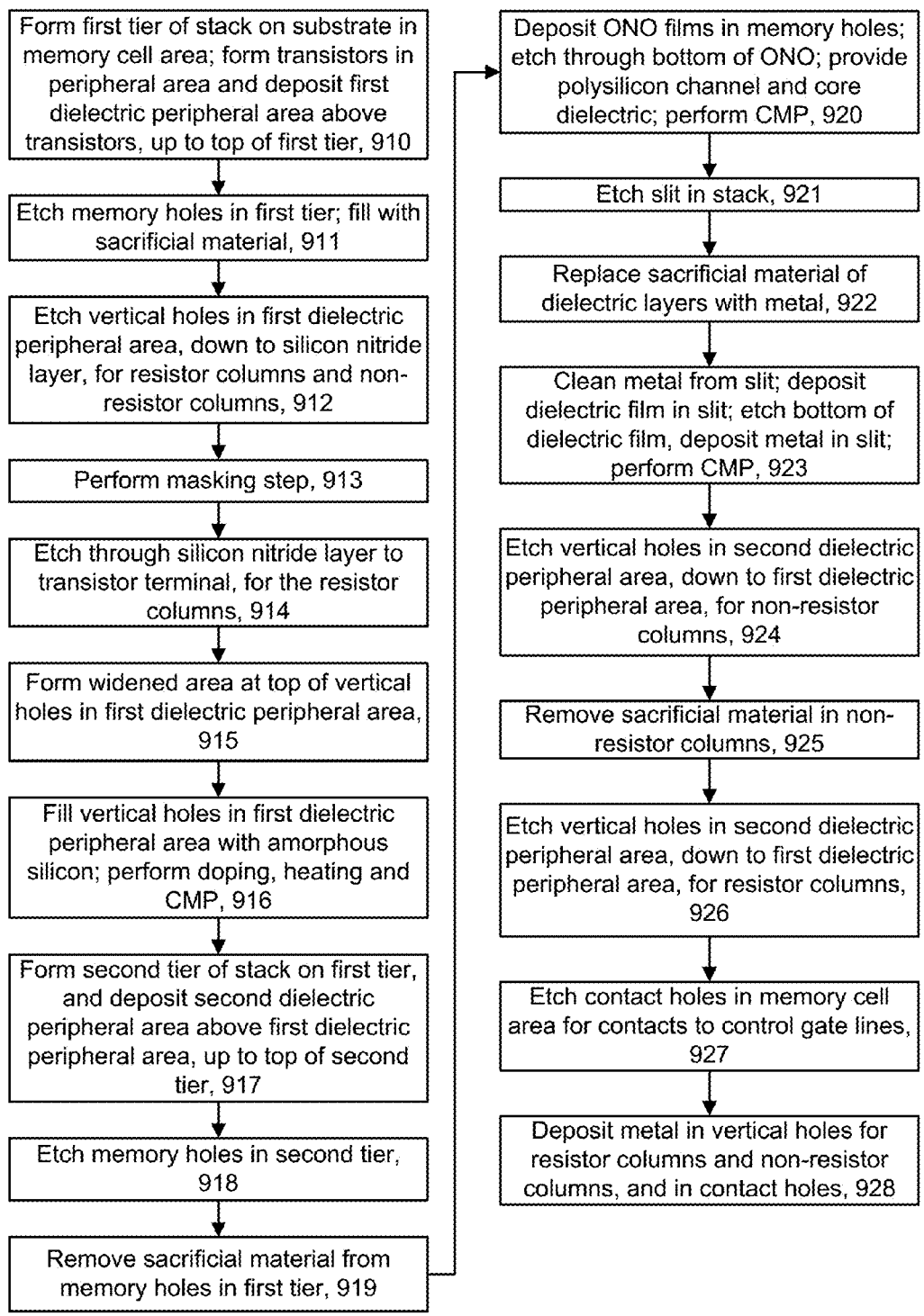
FIG. 9B depicts an example fabrication process for a semiconductor structure consistent with FIG. 9A.

FIG. 8A depicts example NAND strings in the sub-blocks SBa-SBd of FIG. 6. The sub-blocks are consistent with the structure of FIG. 3. The conductive layers in the stack are depicted for reference at the left hand side. Each sub-block includes multiple NAND strings, where one example NAND string is depicted. For example, SBa comprises an example NAND string NS0_SBa, SBb comprises an example NAND string NS0_SBb, SBc comprises an example NAND string NS0_SBc, and SBd comprises an example NAND string NS0_SBd.

Additionally, NS0_SBa include SGS transistors 800 and 801, dummy memory cells 802 and 803, data memory cells 804, 805, 806, 807, 808, 809, 810, 811, 812, 813 and 814, dummy memory cells 815 and 816, and SGD transistors 817 and 818.

NS0_SBb include SGS transistors 820 and 821, dummy memory cells 822 and 823, data memory cells 824, 825, 826, 827, 828, 829, 830, 831, 832, 833 and 834, dummy memory cells 835 and 836, and SGD transistors 837 and 838.

NS0_SBc include SGS transistors 840 and 841, dummy memory cells 842 and 843, data memory cells 844, 845, 846, 847, 848, 849, 850, 851, 852, 853 and 854, dummy memory cells 855 and 856, and SGD transistors 857 and 858.

NS0_SBd include SGS transistors 860 and 861, dummy memory cells 862 and 863, data memory cells 864, 865, 866, 867, 868, 869, 870, 871, 872, 873 and 874, dummy memory cells 875 and 876, and SGD transistors 877 and 878.

Memory cells on WL8 include memory cells 812, 832, 852 and 872. Memory cells on WL9 include memory cells 813, 833, 853 and 873. In this example, the programming of the block may occur sub-block by sub-block. For example, SBa may be programmed from WLL0-WLL10, then SBb may be programmed from WLL0-WLL10, then SBc may be programmed from WLL0-WLL10 and then SBd may be programmed from WLL0-WLL10.

FIG. 8B depicts another example view of NAND strings in sub-blocks. The NAND strings includes NS0_SBa, NS0_SBb, NS0_SBc and NS0_SBd, which have 48 word lines, WL0-WL47, in this example. Each sub-block comprises a set of NAND strings which extend in the x direction and which have a common SGD line, e.g., SGD0, SGD1, SGD2 or SGD3. In this simplified example, there is only one SGD transistor and one SGS transistor in each NAND string. The NAND strings NS0_SBa, NS0_SBb, NS0_SBc and NS0_SBd are in sub-blocks SBa, SBb, SBc and SBd, respectively.

Figure 17:
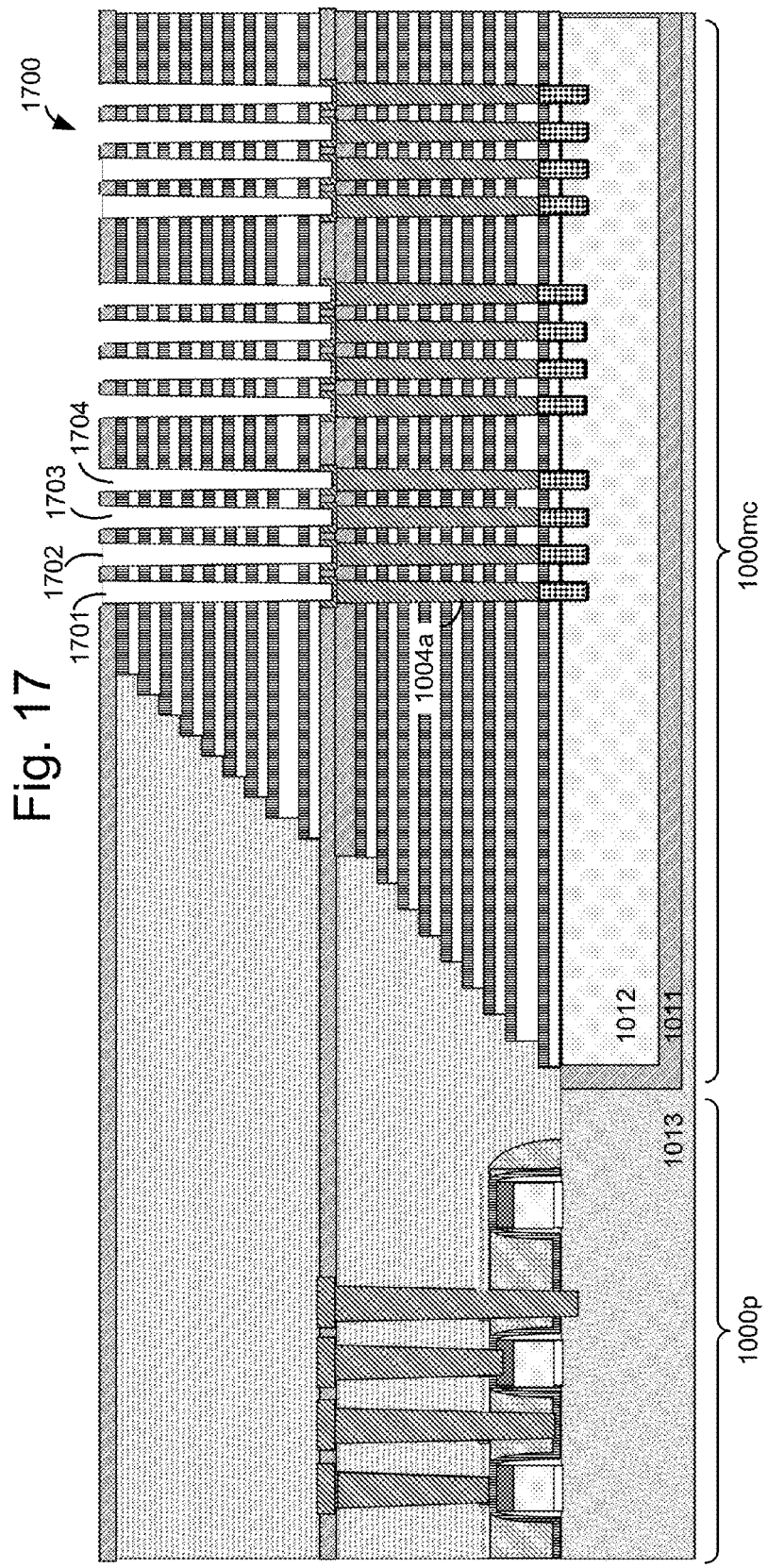
FIG. 17 depicts a semiconductor structure in a configuration which is consistent with step 918 of FIG. 9B.
Figure 18:
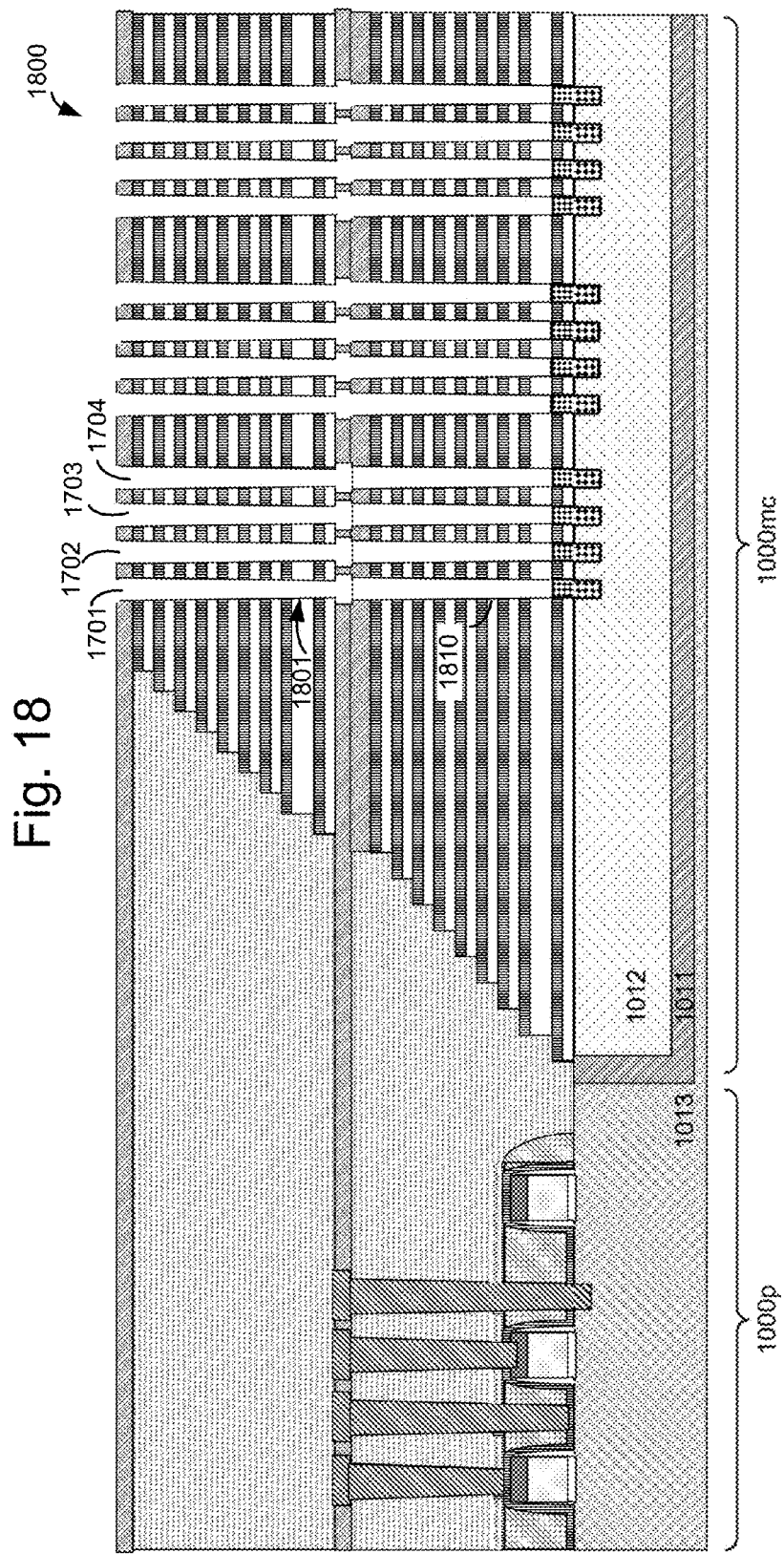
FIG. 18 depicts a semiconductor structure in a configuration which is consistent with step 919 of FIG. 9B.

FIG. 9A depicts an overview of an example fabrication process for a semiconductor structure which includes a multi-tiered stack of memory cells in a memory cell area of a substrate and a columnar resistor in a peripheral area of the substrate. Step 900 includes forming a first tier of a stack with memory holes in a memory cell area of a substrate. See, e.g., FIG. 10. Step 901 includes forming vertical holes in a dielectric peripheral area of the substrate for resistor columns and non-resistor columns (FIG. 11-14), and providing doped polysilicon in the vertical holes (FIG. 15). A resistor column may be a column, e.g., pillar, which comprises polysilicon or other material and is used as a resistor in a circuit. A non-resistor column may be a column which does not comprise a material for use as a resistor in a circuit. For example, a non-resistor column may comprise metal for use as contact but not polysilicon. Step 902 includes, on the first tier, forming a second tier of the stack with memory holes (FIG. 16-18).

Figure 19:
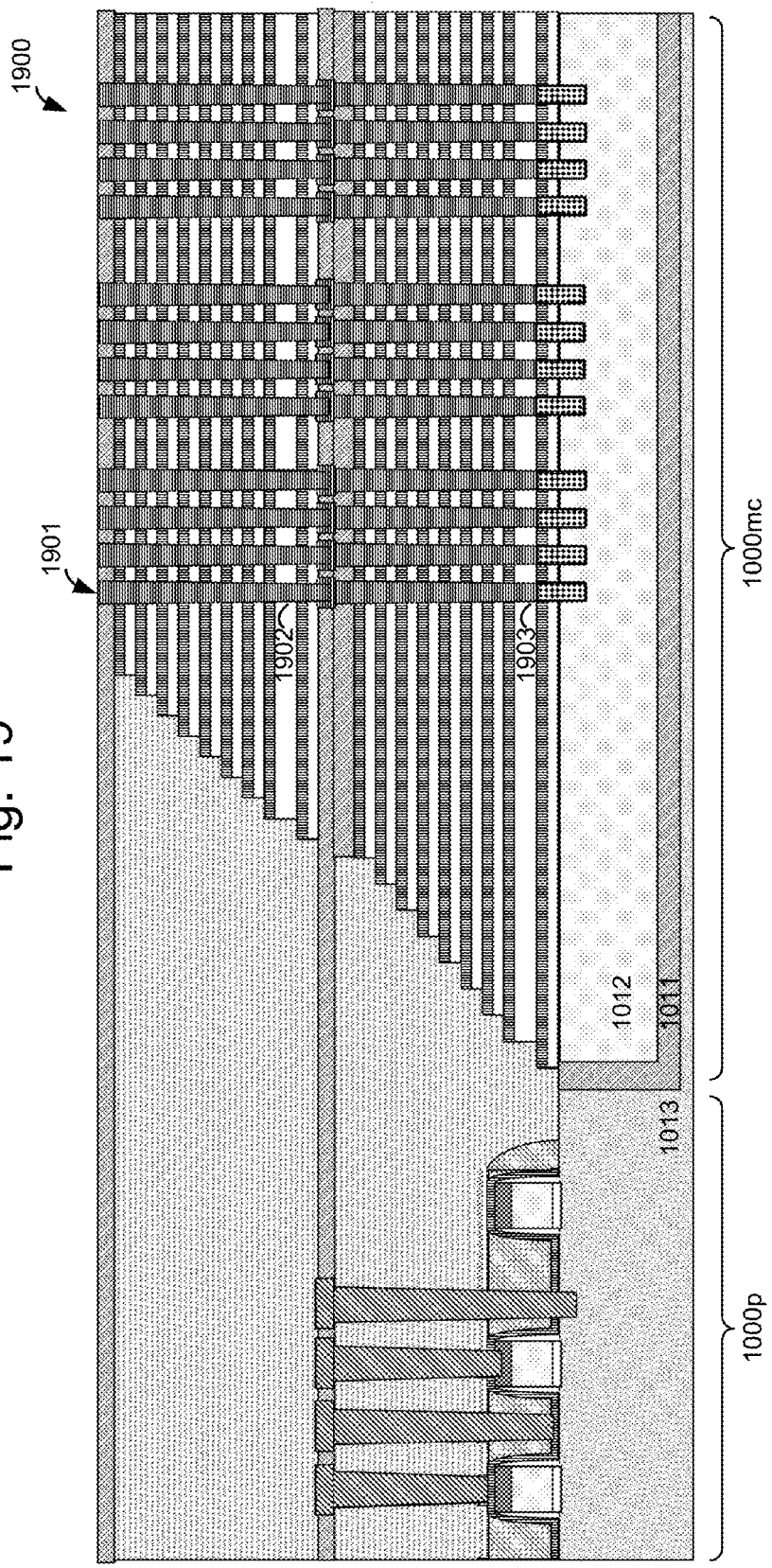
FIG. 19 depicts a semiconductor structure in a configuration which is consistent with step 920 of FIG. 9B.
Figure 23:
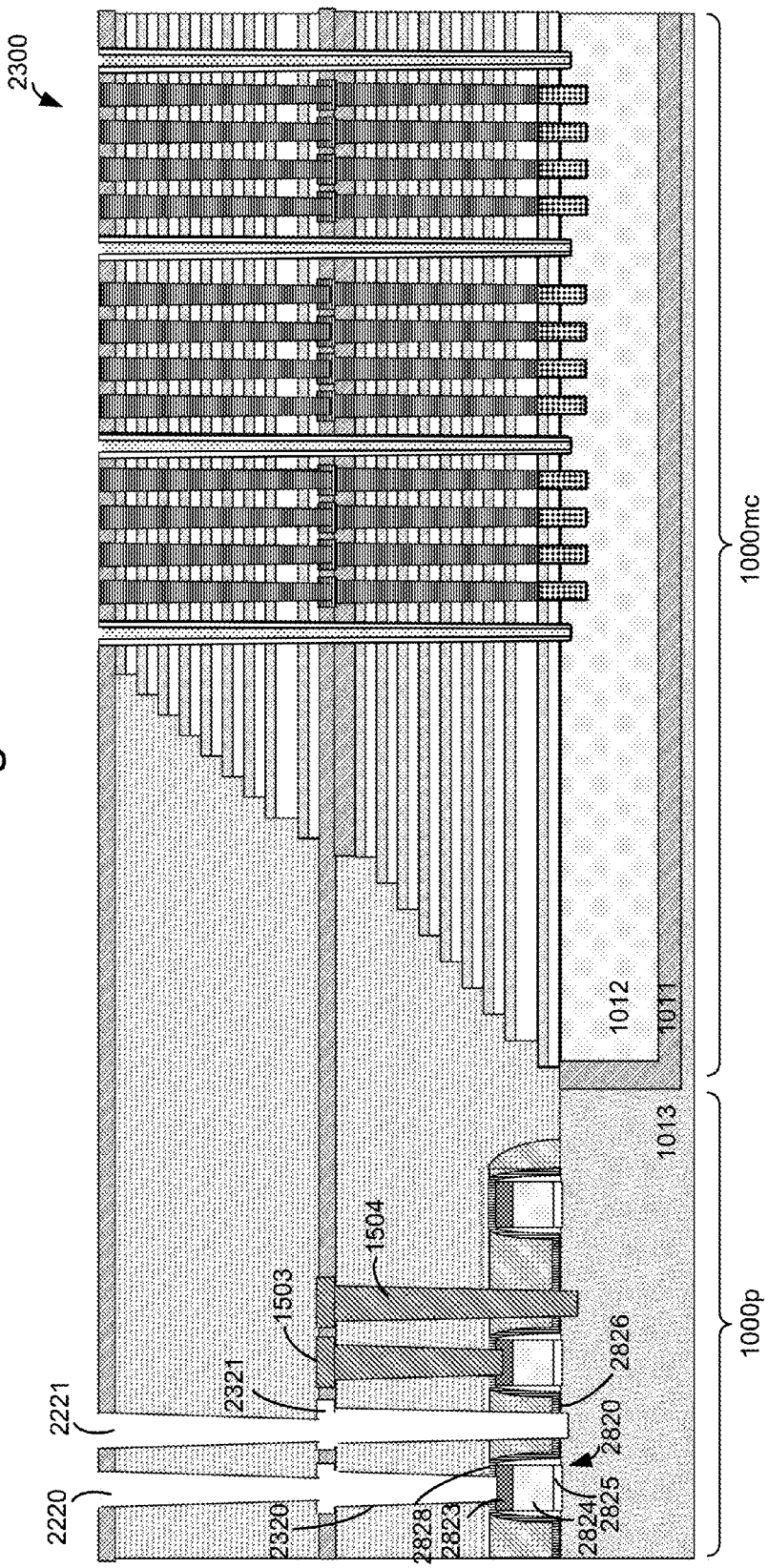
FIG. 23 depicts a semiconductor structure in a configuration which is consistent with step 925 of FIG. 9B.
Figure 24:
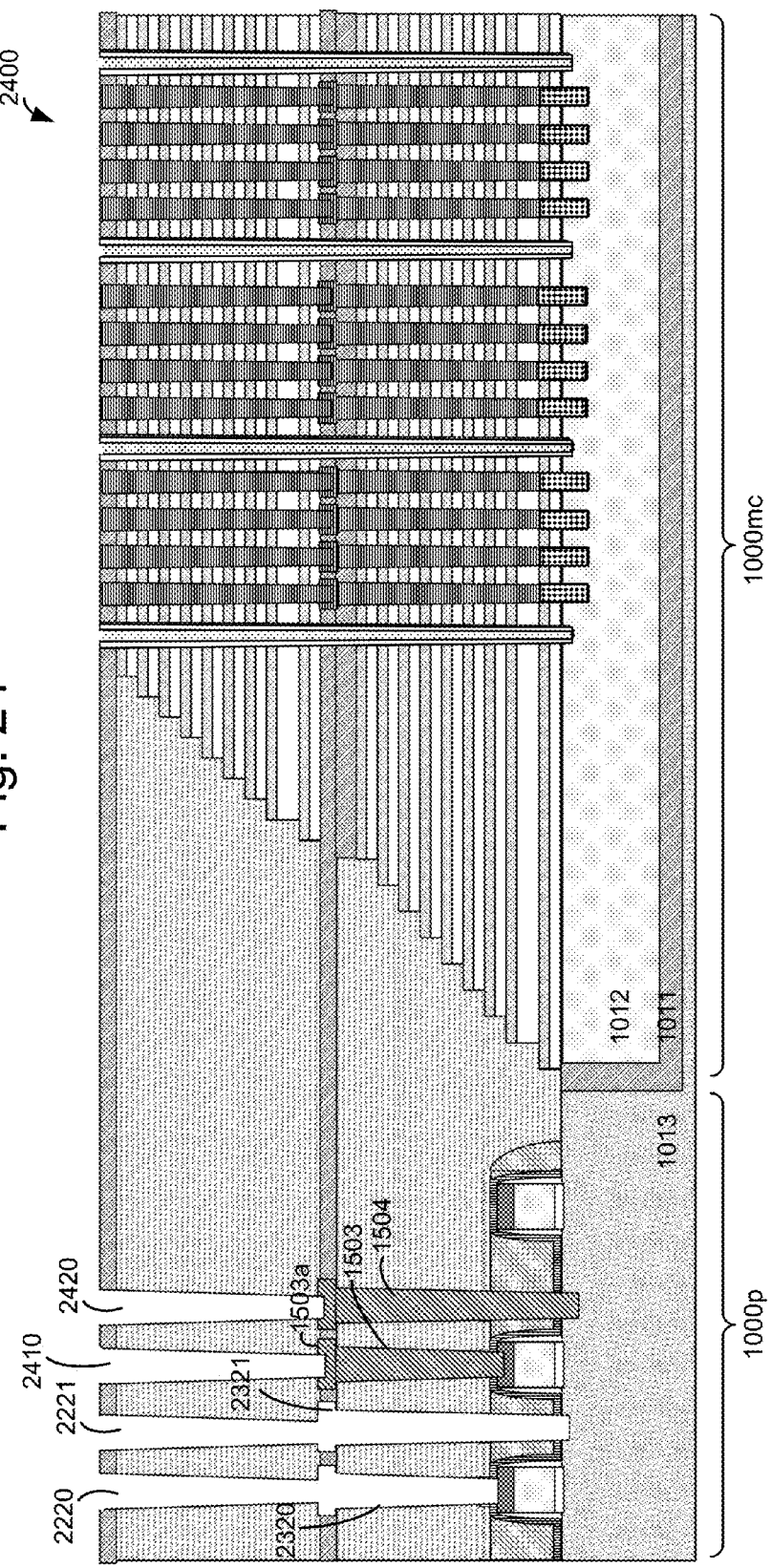
FIG. 24 depicts a semiconductor structure in a configuration which is consistent with step 926 of FIG. 9B.

Step 903 includes depositing memory films in the memory holes (FIG. 19). Portions of the films which are adjacent to control gate layers of the stack become charge-storing regions of memory cells. Step 904 includes removing doped polysilicon from the non-resistor columns (FIG. 23). Step 905 includes forming vertical holes in the dielectric peripheral area above the resistor columns, where the holes extend up to a top of the stack (FIG. 24). Step 906 includes depositing metal in the resistor columns, where the metal extends from the top of the doped polysilicon to a height of the top of the stack. Step 907 includes depositing metal in the non-resistor columns, where the metal extends from a terminal of a transistor on the substrate to a height of the top of the stack. Steps 906 and 907 can be concurrent, at least in part.

FIG. 9B depicts an example fabrication process for a semiconductor structure consistent with FIG. 9A. Step 910 includes forming a first tier of a stack on a substrate in a memory cell area. This step also includes forming transistors in a peripheral area and depositing a first dielectric peripheral area above the transistors, up to a top of the first tier. See, e.g., FIG. 10. Step 911 includes etching memory holes in the first tier, and filling the memory holes with a sacrificial material, such as SiN. See, e.g., FIG. 10. Step 912 includes etching vertical holes in the first dielectric peripheral area, down to a silicon nitride layer or other etch stop layer. See, e.g., FIG. 11. These vertical holes can be for resistor columns and non-resistor columns, for instance. Step 913 includes performing a masking step. See, e.g., FIG. 12. This involves masking the holes for the non-resistor columns. Step 914 includes etching through the silicon nitride layer to a transistor terminal, e.g., a gate, source or drain of the transistor, for the resistor columns. See, e.g., FIG. 13. For example, the terminal can be above the substrate or in the substrate. Step 915 includes forming a widened area at the top of the vertical holes in the first dielectric peripheral area. This provides a larger area for the overlaying vertical holes to make contact, to allow for some misalignment. See, e.g., FIG. 11.

Step 916 includes filling the vertical holes in the first dielectric peripheral area with amorphous silicon, and performing doping, heating and chemical-mechanical polishing (CMP). See, e.g., FIG. 15. These vertical holes can be for resistor columns and non-resistor columns, for instance. The doping can be performed during and/or after the deposition of the amorphous silicon. The heating step converts the amorphous silicon to polysilicon. For example, the heating can be at 850 C for 30 minutes followed by a crystallization anneal at 1000 C for 30 seconds. The CMP removes excess polysilicon. In another approach, polysilicon is deposited into the vertical holes. Step 917 includes forming a second tier of the stack on the first tier, and depositing a second dielectric peripheral area above the first dielectric peripheral area, up to a top of the second tier. See, e.g., FIG. 16. Step 918 includes etching memory holes in the second tier. See, e.g., FIG. 17. Step 919 includes removing sacrificial material from the memory holes in the first tier, e.g., using a wet etch. See, e.g., FIG. 18.

Step 920 includes depositing oxide-nitride oxide (ONO) films in the memory holes. See, e.g., FIG. 19. Step 921 includes etching a slit in the stack. See, e.g., FIG. 20. Step 922 includes replacing the sacrificial material of the dielectric layers of the stack with metal. This can involve providing an etchant via the slit which removes the sacrificial material, creating voids, then providing metal via the slit which fills the voids. See, e.g., FIG. 21. Step 923 includes cleaning metal from the slit, depositing a dielectric film in the slit which coast the walls of the slit, etching a bottom of the dielectric film, depositing metal in the slit, and performing CMP to remove excess metal. This step can provide a conductive metal path in the slit from a top of the stack to the substrate, to connect to circuitry below the stack. See, e.g., FIG. 22. Step 924 includes etching vertical holes in the second dielectric peripheral area, down to the first dielectric peripheral area, for non-resistor columns. See, e.g., FIG. 22.

Step 925 includes removing the sacrificial material in the non-resistor columns which was provided in step 916. See, e.g., FIG. 23. An etchant which is used to remove the sacrificial material can also result in removing a portion of a silicon nitride layer which is below the sacrificial material, so that the void of the non-resistor columns extends down to another etch stop layer or to the substrate. The metal which is deposited in the non-resistor columns in step 928 can therefore contact the another etch stop layer or the substrate. For example, in FIG. 23, the vertical hole 2220 extends through the portion 2828 of the silicon nitride layer when the sacrificial material of the polysilicon column 1501 is etched away, and the vertical hole 2221 extends through the portion 2826 of the silicon nitride layer when the sacrificial material of the polysilicon column 1502 is etched away.

Step 926 includes etching vertical holes in the second dielectric peripheral area, down to the first dielectric peripheral area, for resistor columns. See, e.g., FIG. 24. Step 927 includes etching contact holes in the memory cell area for contacts to the control gate lines. See, e.g., FIG. 25. Step 928 includes depositing metal in the vertical holes for resistor columns and non-resistor columns, and in the contact holes. The metal can be deposited concurrently in the various holes, for instance. See, e.g., FIG. 26.

Note that some of the steps can be performed in a different order than the order shown in FIG. 9B. For example, steps 918-923 could be performed after steps 924-926.

FIG. 10 depicts a semiconductor structure 1000 in a configuration which is consistent with step 910 and 911 of FIG. 9B. The structure includes a memory cell area 1000$mc$ and a peripheral area 1000$p$ of a substrate 1000$s$. The substrate comprises an intrinsic silicon region 1013, a deep n-well 1011 and a p-well 1012, for instance. A first tier 1001 of a stack includes alternating dielectric layers and control gate layers. The control gate layers may comprise a sacrificial material at this stage of the fabrication. An example dielectric layer 1003 and an example control gate layer 1002 are depicted. A dielectric layer 1051 extends on top of the stack while a dielectric layer 1050 extends on top of the semiconductor structure. The dielectric layer 1050 may be, e.g., SiN deposited by low pressure chemical vapor deposition (LPCVD) or plasma-enhanced chemical vapor deposition (PECVD), for instance. The dielectric layer 1051 may be, e.g., SiOx deposited by LPCVD or PECVD, for instance.

A first dielectric peripheral area 1010 includes example transistors 1020, 1030 and 1040. These transistors may be components in a circuit for controlling the stack, for instance. An etch stop material 1021 or layer such as SiN is formed on top of each transistor and a substrate etch stop material 1023 is formed on top of the substrate, between the transistors. The dielectric peripheral area may be, e.g., a plasma-enhanced oxide such as tetraethyl orthosilicate (TEOS) or a coating material such as silicon on glass (SOG).

The memory cell area includes a plurality of memory holes. An example memory hole 1004 (also referred to as a column or pillar when the memory hole is filled) includes a widened top portion 1006 above an elongated portion 1005. A source side region 1007 is below the memory hole. A top 1052$t$ and a bottom 1052$b$ of the stack are also depicted.

FIG. 11 depicts a semiconductor structure 1100 in a configuration which is consistent with step 912 of FIG. 9B. 1210 Vertical holes 1101, 1102, 1103 and 1104 are depicted. The vertical holes 1101 and 1103 extend down to the etch stop material 1021, while the vertical holes 1102 and 1104 extend down to the etch stop layer 1023, in this example. A first etch chemistry may be used which is selective of the first dielectric peripheral area 1010. The stack may be protected by a mask during the etching of the peripheral area.

Figure 12:
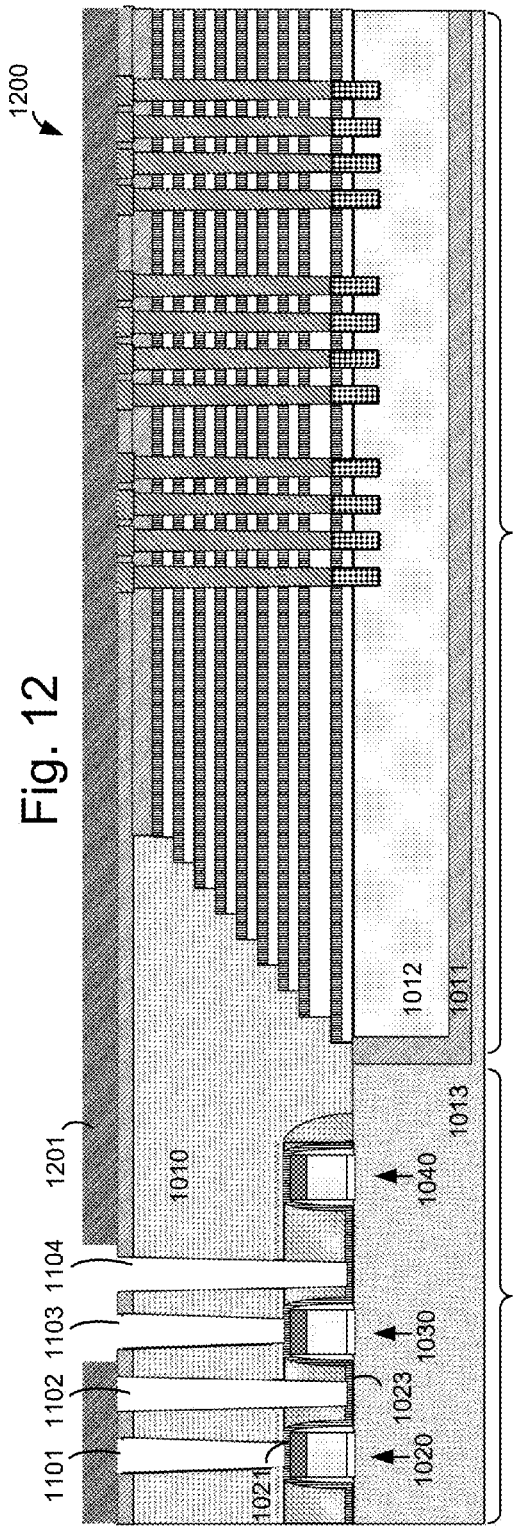
FIG. 12 depicts a semiconductor structure in a configuration which is consistent with step 913 of FIG. 9B.

FIG. 12 depicts a semiconductor structure 1200 in a configuration which is consistent with step 913 of FIG. 9B. A mask layer 1201 such as photoresist is provided to shield the memory cell area from the second etching in the peripheral area. Additionally, the vertical holes 1101, and 1102 are masked to prevent the etchant from entering these vertical holes and eroding portions of the substrate which are below these vertical holes.

Figure 13:
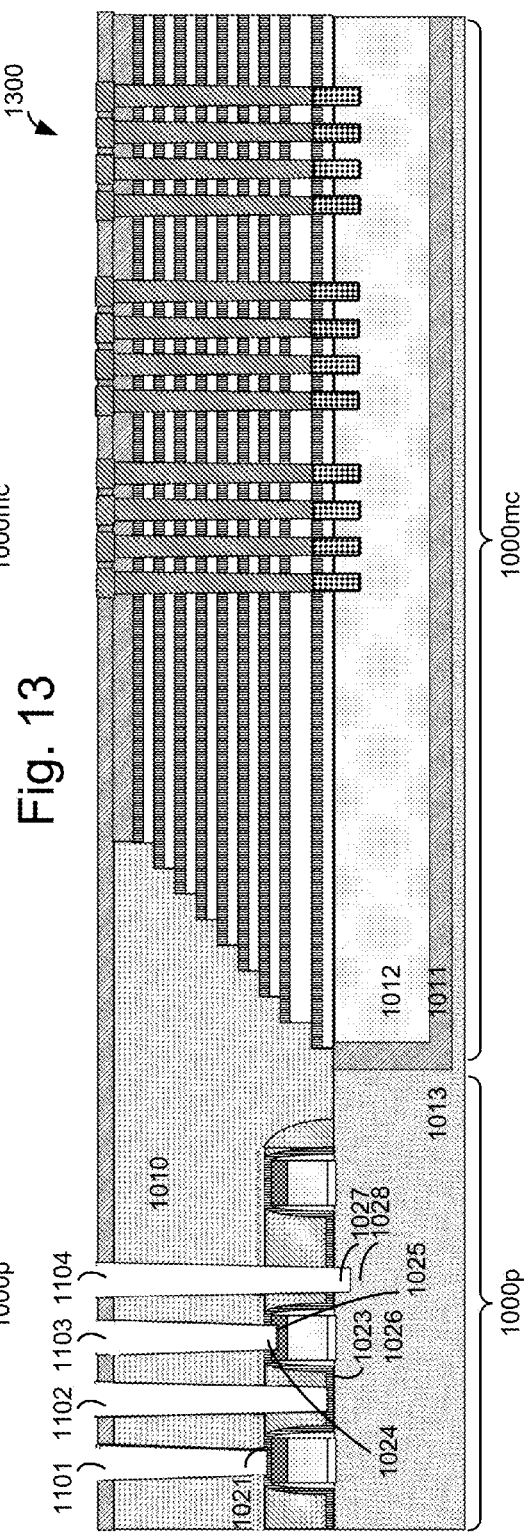
FIG. 13 depicts a semiconductor structure in a configuration which is consistent with step 914 of FIG. 9B.

FIG. 13 depicts a semiconductor structure 1300 in a configuration which is consistent with step 914 of FIG. 9B. The vertical holes may be etched further down, through the etch stop layers using a second etch chemistry, different than the first etch chemistry. The second etch chemistry is selective of the etch stop material 1021 and 1023. A bottom 1024 of the hole 1103 extends down to a transistor terminal 1025, and a bottom 1027 of the hole 1103 extends down to a silicon region 1028 of the substrate, where a transistor terminal may be formed. See, e.g., FIGS. 28A and 29 for examples of transistor terminals in a substrate.

FIG. 14 depicts a semiconductor structure 1400 in a configuration which is consistent with step 915 of FIG. 9B. Top portions of the holes in the peripheral are widened using an appropriate mask (not shown) and etchant. An example widened portion 1410 is depicted. The memory holes also have a widened portion (such as example widened portion 1411) in the dielectric layer. The widened portions 1410 and 1411 provide a larger area for the overlaying holes to make contact, even when there is some misalignment.

FIG. 15 depicts a semiconductor structure 1500 in a configuration which is consistent with step 916 of FIG. 9B. Amorphous silicon is provided in the vertical holes 1101, 1102, 1103 and 1104, in one example. Polysilicon is then formed from the amorphous silicon using a heating step. This results in polysilicon columns 1501, 1501, 1503 and 1504. A bottom 1524 of the polysilicon column 1501 contacts the transistor terminal 1025, and bottom 1526 of the polysilicon column 1503 contacts a transistor terminal in the substrate. The polysilicon column 1501 has a widened portion 1501a and an elongated vertically extending portion 1501b. The polysilicon column 1504 has a widened portion 1504a and an elongated vertically extending portion 1504b.

FIG. 16 depicts a semiconductor structure 1600 in a configuration which is consistent with step 917 of FIG. 9B. A second tier 1601 of a stack includes alternating dielectric layers and control gate layers. An example dielectric layer 1603 and an example control gate layer 1602 are depicted. A dielectric layer 1650 extends on top of the stack 1660 and the semiconductor structure 1600. A second dielectric peripheral area 1610 is also formed.

FIG. 17 depicts a semiconductor structure 1700 in a configuration which is consistent with step 918 of FIG. 9B. Example memory holes 1701, 1702, 1703 and 1704 are provided in the second tier of the stack. The memory holes in the second tier (e.g., example memory hole 1701) are aligned with the sacrificial material in the memory holes in the first tier (e.g., example sacrificial material 1004a). The peripheral area may be protected by a mask during the etching of the stack.

FIG. 18 depicts a semiconductor structure 1800 in a configuration which is consistent with step 919 of FIG. 9B. Once the sacrificial material in the first tier is removed, a continuous memory hole 1801 is formed from the top of the stack to the bottom of the stack. The continuous memory hole comprises the memory hole portion 1810 of the first tier and the memory hole portion 1701 of the second tier.

FIG. 19 depicts a semiconductor structure 1900 in a configuration which is consistent with step 920 of FIG. 9B. The memory holes are filled with materials such as ONO films, a polysilicon channel and a core dielectric. To provide the polysilicon channel, amorphous silicon may be deposited follow by a heating step. This results in a column 1901 comprising a column 1902 in the second tier above a column 1903 in the first tier.

Figure 20:
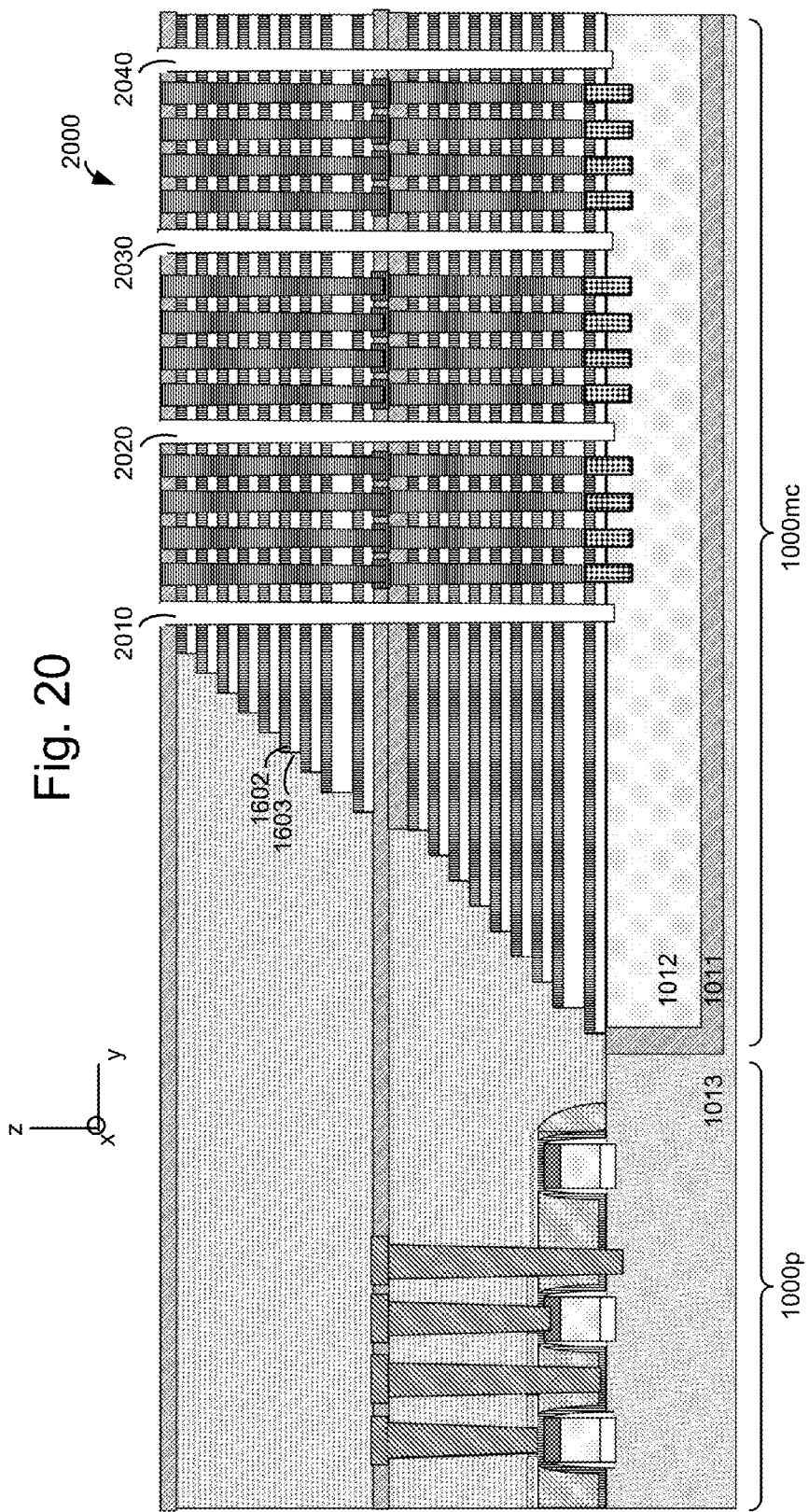
FIG. 20 depicts a semiconductor structure in a configuration which is consistent with step 921 of FIG. 9B.

FIG. 20 depicts a semiconductor structure 2000 in a configuration which is consistent with step 921 of FIG. 9B. Example slits 2010, 2020, 2030 and 2040 are formed in the stack. Each slit may have a uniform cross-section in the y-z plane and extend across the stack in the x direction. The peripheral area may be protected by a mask during the etching of the stack.

Figure 21:
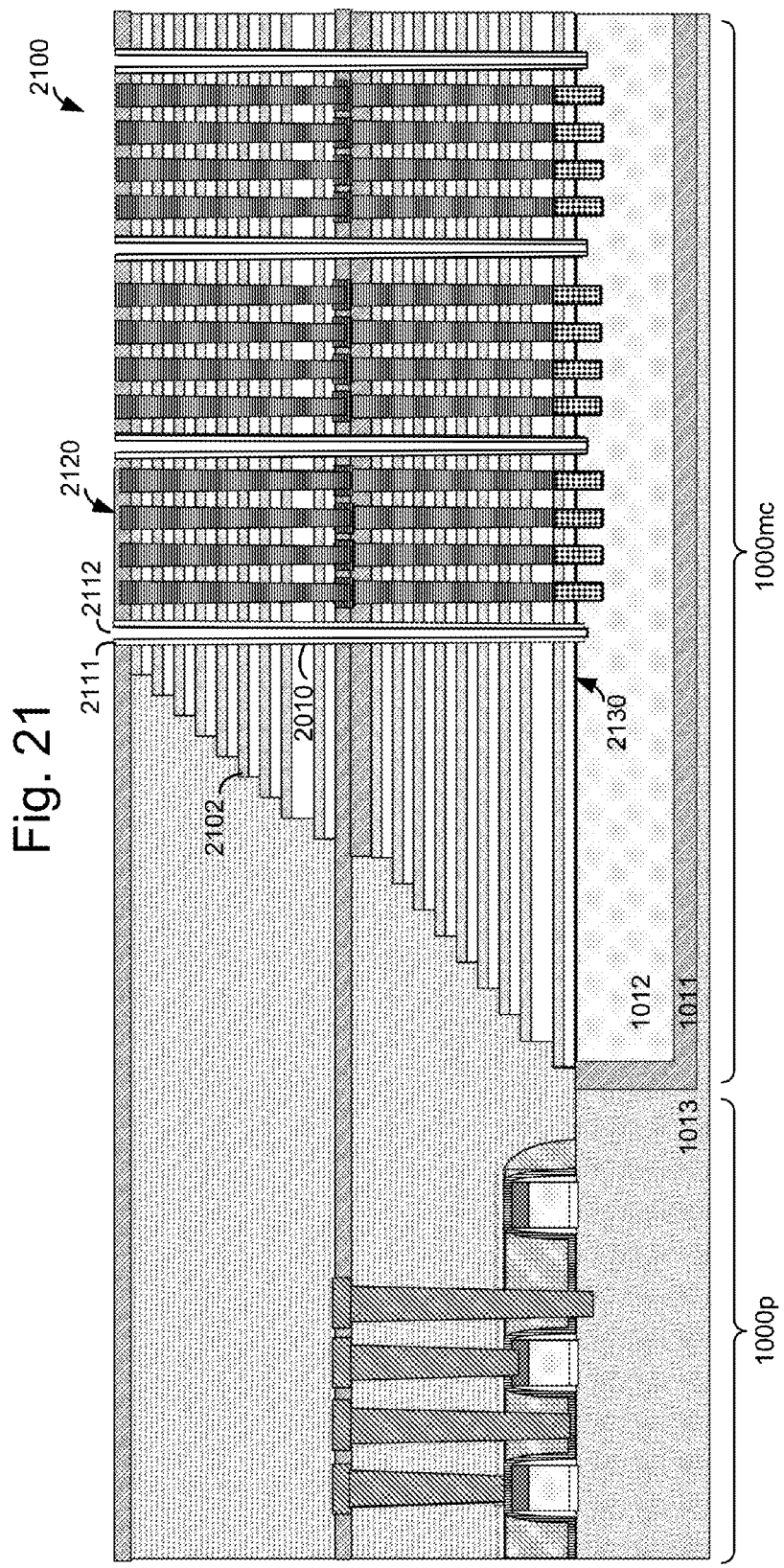
FIG. 21 depicts a semiconductor structure in a configuration which is consistent with step 922 of FIG. 9B.

FIG. 21 depicts a semiconductor structure 2100 in a configuration which is consistent with step 922 of FIG. 9B. The sacrificial material of the control gate layers is removed and replaced with a metal such as tungsten. For example, a metal 2102 is provided for the control gate layer 1602. A metal residual is then removed from the slits and a dielectric film 2111 is deposited in the slits. A void 2112 exists between the walls of the slit. The void may extend from the p-well 1012 at a bottom 2130 of the stack to the top of 2120 the stack.

Figure 22:
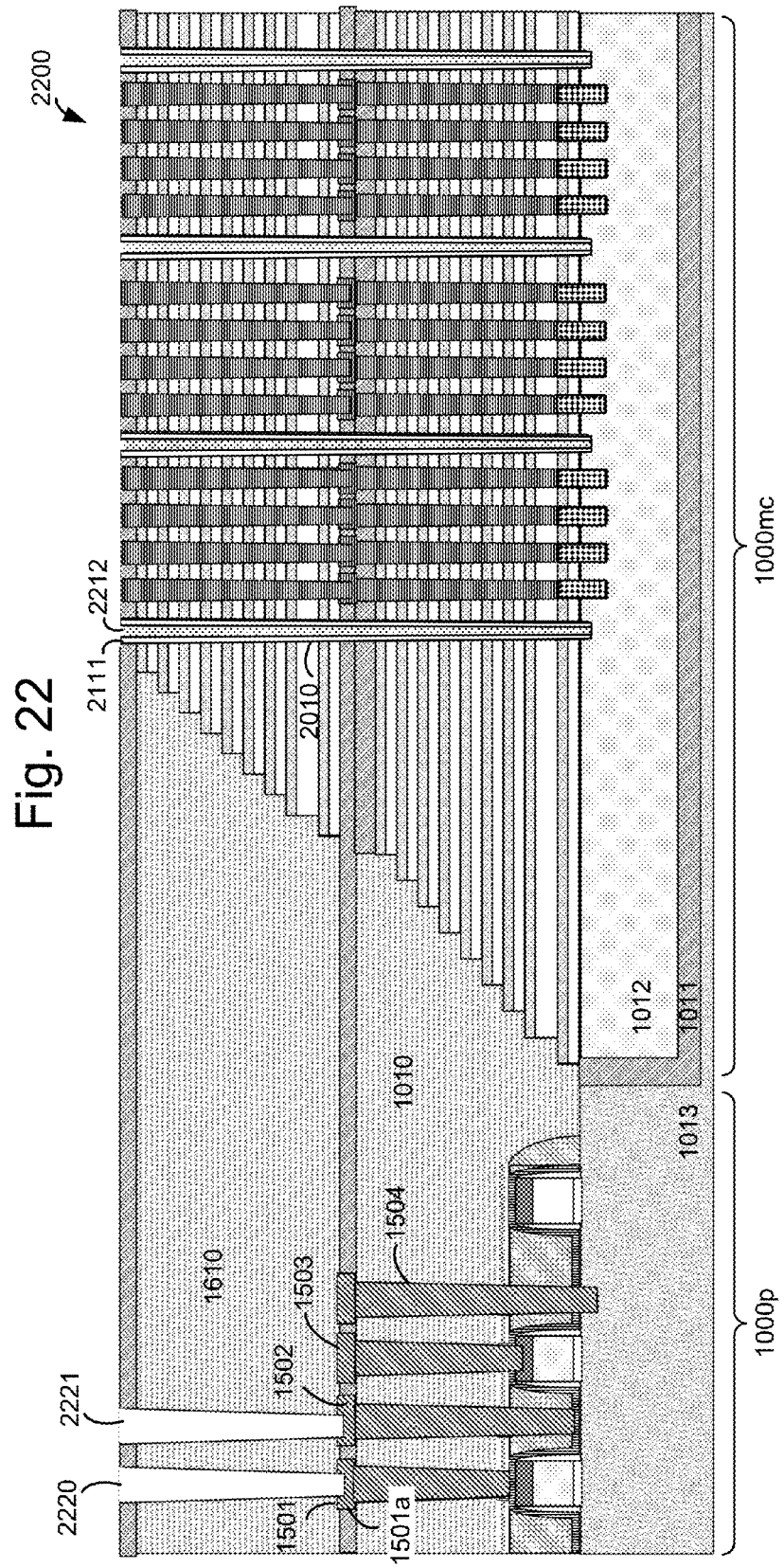
FIG. 22 depicts a semiconductor structure in a configuration which is consistent with step 923 and 924 of FIG. 9B.

FIG. 22 depicts a semiconductor structure 2200 in a configuration which is consistent with step 923 and 924 of FIG. 9B. Metal 2212 is provided in the void 2112. The metal may extend from the p-well 1012 at a bottom 2130 of the stack to the top of 2120 the stack. Vertical holes 2220 and 2221 and provided in the second dielectric peripheral area 1610, down to the first dielectric peripheral area 1010, for non-resistor columns. The stack may be protected by a mask during the etching of the peripheral area. The vertical hole 2220 extends down to the widened portion 1501a of the polysilicon column 1501. The vertical hole 2221 extends down to the widened portion of the polysilicon column 1502.

An etchant used to etch the second dielectric peripheral area 1610 to provide the vertical holes 2220 and 2221 may be selective of the dielectric but not of the polysilicon column 1501.

FIG. 23 depicts a semiconductor structure 2300 in a configuration which is consistent with step 925 of FIG. 9B. The sacrificial material, e.g., polysilicon, of the polysilicon columns 1501 and 1502 is removed such as by providing an etchant in the vertical holes 2220 and 2221, respectively. The etching results in voids 2320 and 2321 in the first tier. One or more continuous voids are formed in the peripheral area which extend from a transistor terminal to a height of a top of the stack.

An example transistor 2820 is a MOSFET. The substrate includes n or p type diffusion regions (see FIG. 28A) which act as source/drain terminals of the transistor. The transistor also includes a conductive etch stop layer 2823, a control gate 2824 and a gate oxide 2825. A silicon nitride layer extends in a blanket deposition on the substrate and over the transistor. The silicon nitride layer includes a portion 2826 on the substrate and a portion 2828 on a top of the transistor.

FIG. 24 depicts a semiconductor structure 2400 in a configuration which is consistent with step 926 of FIG. 9B. Vertical holes 2410 and 2420 and provided in the second dielectric peripheral area for non-resistor columns. The vertical hole 2410 extends down to the widened portion 1503a of the polysilicon column 1503. The vertical hole 2420 extends down to the widened portion of the polysilicon column 1504. The etchant used to etch the second dielectric peripheral area 1610 to provide the vertical holes 2410 and 2420 may be selective of the dielectric but not of the polysilicon column 1503. The vertical holes 2220 and 2221 may be masked when etching the vertical holes 2410 and 2420.

Figure 25:
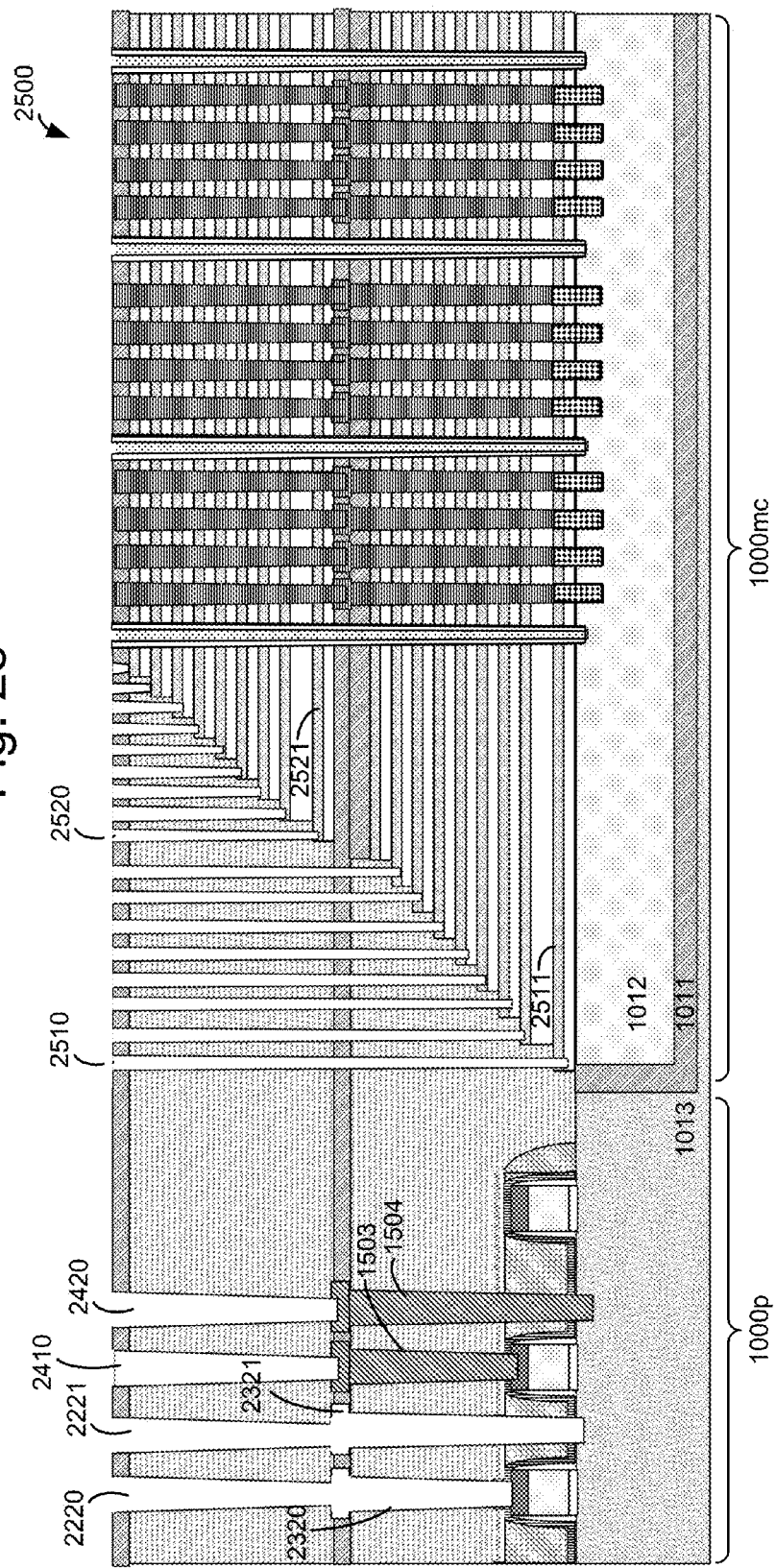
FIG. 25 depicts a semiconductor structure in a configuration which is consistent with step 927 of FIG. 9B.

FIG. 25 depicts a semiconductor structure 2500 in a configuration which is consistent with step 927 of FIG. 9B. Contacts holes are etched in the memory cell area to provide voids which extend upward from the control gate layers to the top of the stack. For example, in the first tier, a contact hole 2510 is provided for the control gate layer 2511. In the second tier, a contact hole 2520 is provided for the control gate layer 2521.

FIG. 26 depicts a semiconductor structure 2600 in a configuration which is consistent with step 928 of FIG. 9B. The voids/holes in the peripheral area and the memory cell area are filled with metal. In the peripheral area, columns 2610, 2611, 2612 and 2613 are formed. The columns 2610 and 2611 (non-resistor columns) are metal columns, from the transistor terminal to a height of the top of the stack. The columns 2612 and 2613 (resistor columns) are part metal, part polysilicon columns. The polysilicon part is in the first tier, and the metal part is in the second tier, in this example. In the memory cell area, metal columnar contacts such as 2615 and 2620 allow voltages to be provided to the control gate layers.

Subsequently, the contacts to the control gate layers and the resistor and non-resistor columns may be connected to metal paths above the stack. For example, a via 2630a connects the resistor column 2612 to an above-stack metal path 2630b. A via 2630c connects the metal contact 2615 to the above-stack metal path 2630a. In this case, the resistor column 2612 could be a component in a circuit which provides a voltage to the control gate layer 2511. Many other types of circuits can be provided as well.

A z-axis depicts different heights in the semiconductor device including z0 (substrate surface or height of transistor terminal in substrate), z1 (height of transistor terminal above substrate), z2 (height of top of first tier), and z3 (height of top of second tier or top of stack).

The semiconductor structure is an example of a three-dimensional structure in which memory cells are arranged in NAND strings.

FIG. 27A depicts an example of a column which includes a columnar polysilicon resistor 2700 below a columnar metal contact 2702. This example is consistent with the resistor columns 2612 and 2613 of FIG. 26. This column provides one portion which is resistive and therefore has a relatively low conductivity, and another portion which has a relatively high conductivity. This configuration may be suitable when the resistor portion has a sufficiently high resistance for the circuit in which it is used.

FIG. 27B depicts an example of a columnar polysilicon resistor 2710 with regions 2710a, 2710b and 2710c with different dopant concentrations, below the columnar metal contact 2702. In one approach, as mentioned, different layers of silicon may be deposited in turn while in situ doping is performed at different concentrations. For example, the outermost layer 2710a may be intrinsic or the least doped among the layers, the second outermost layer 2710b may be doped by the second lowest concentration among the layers, and the innermost or core region 2710c may be doped by the highest concentration among the layers. The layers 2710a and 2710b are surrounding regions of the core region 2710c. In this case, the doping concentration decreases when moving radially outward from a central longitudinal axis of the resistor. Or, the reverse case may be true where the doping concentration increases when moving radially outward from the central longitudinal axis of the resistor. Thus, the core may be intrinsic while the surrounding region is doped, or the core may be doped while the surrounding region is intrinsic.

By using different doping concentrations, the overall resistance of the polysilicon resistor can be set to a desired level. Generally, the resistance can be decreased by doping a relatively larger portion of the polysilicon and by using a relatively larger doping concentration.

In one approach, the providing the polysilicon in the first vertical hole comprises separately depositing intrinsic amorphous silicon in the first vertical hole and depositing doped amorphous silicon in the first vertical hole, and performing a heating step which converts the intrinsic amorphous silicon to intrinsic polysilicon and which converts the doped amorphous silicon to doped polysilicon.

The approach of FIG. 27B is useful for in situ doping, where it is difficult to control the dopant concentration when it is relatively low, such as less than 1E19/cm3. In an example implementation, the highest doping concentration is 1E19-22/cm3 of Boron (for a p-type resistor) or Phosphorus or Arsenic (for an n-type resistor) in the core region 2710c, and a total concentration in the body of the resistor is about 1E17-20/cm3. Providing a sufficient doping concentration (e.g., 1E19-22/cm3) at the top surface of the polysilicon pillar where it touches the bottom surface of the metal pillar helps provide a good ohmic contact to the metal pillar.

FIG. 27C depicts an example of a columnar polysilicon resistor 2720 with dopants implanted at different dopant concentrations, below the columnar metal contact 2702. The doping concentration decreases progressively starting from the region 2720a and moving downward to the regions 2720b, 2720c and 2720d. Ion implantation may be used in this case. The implantation energy and dosage can be set to provide a doping concentration of about 1E19-22/cm3 at the top surface of the polysilicon pillar.

FIG. 27D depicts an example of a first column 2730 comprising a polysilicon resistor below a second column 2732, where a bottom portion 2732b of the second column comprises polysilicon and a top portion 2732a of the second column comprises metal. This configuration provides a larger volume of polysilicon to use as a resistor, compared to FIG. 27A, for example. To achieve this configuration, one example approach fills the second column to the top with silicon and then etches the silicon back to a desired height which is partway between a top and bottom of the second column. Another example approach fills the second column with silicon to the desired height, which is partway between a top and bottom of the second column. In either case, the top portion of the second column is then filled with metal, for instance. This example can be extended to more than two tiers/columns as well. For example, with three tiers/columns, the bottom two columns may comprise polysilicon while the top column comprises metal. Or, the bottom column may comprise polysilicon while the top two columns comprise metal. Generally, with an integer number N>=2 of columns, one above the other in the peripheral region, an integer number M>=1 of the columns may comprise polysilicon while an integer number L>=1 of the columns may comprise metal, where N=M+L. Moreover, one or more metal columns may be provided above one or more polysilicon columns, one or more polysilicon columns may be provided above one or more metal columns, or metal columns may alternate with polysilicon columns. It may be more practical to provide the one or more metal columns at the top of the dielectric peripheral area to deposit metal at the same time in the slits in the stack.

FIG. 27E depicts an example of a first column 2740 below a second column 2702, where a bottom portion 2740b of the first column comprises polysilicon, a top portion 2740a of the first column comprises metal, and the second column comprises metal. This configuration provides a smaller volume of polysilicon to use as a resistor, compared to FIG. 27A, for example. To achieve this configuration, one example approach fills the first column to the top with silicon and then etches the silicon back to a desired height which is partway between a top and bottom of the first column. Another example approach fills the first column with silicon to the desired height which is partway between a top and bottom of the first column. In either case, the top portion of the first column is then filled with metal, for instance. The second column is also filled with metal.

FIG. 27F depicts an example of a first column 2750 below a second column 2752, where the first column and the second column both comprise polysilicon. This configuration provides a larger volume of polysilicon to use as a resistor, compared to FIG. 27A or 27D, for example. This may be desired when a circuit calls for a relatively high resistance. The equivalent resistance Req of multiple resistors which are connected in series is the sum of the resistance of each resistor.

Another option involves multiple polysilicon pillars where one pillar has a relatively high doping concentration and acts as a contact to the other pillar, which has a relatively low doping concentration.

Figure 27I:
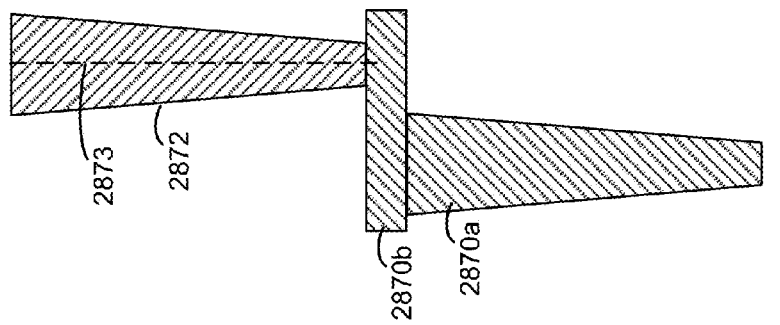
FIG. 27I depicts an example of a first polysilicon column below a second, metal column, where the first and second columns are not aligned with one another.
Figure 27H:
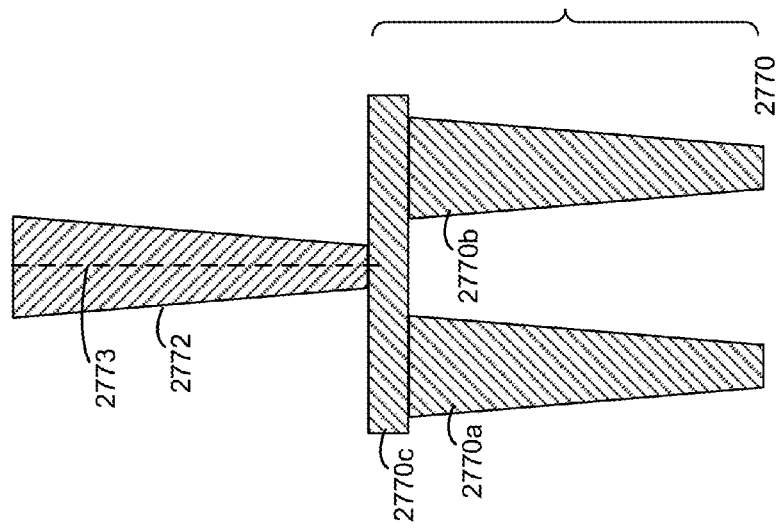
FIG. 27H depicts an example of first and second polysilicon columns below a third, metal column, where the first and second columns are not aligned with the third column.
Figure 27G:
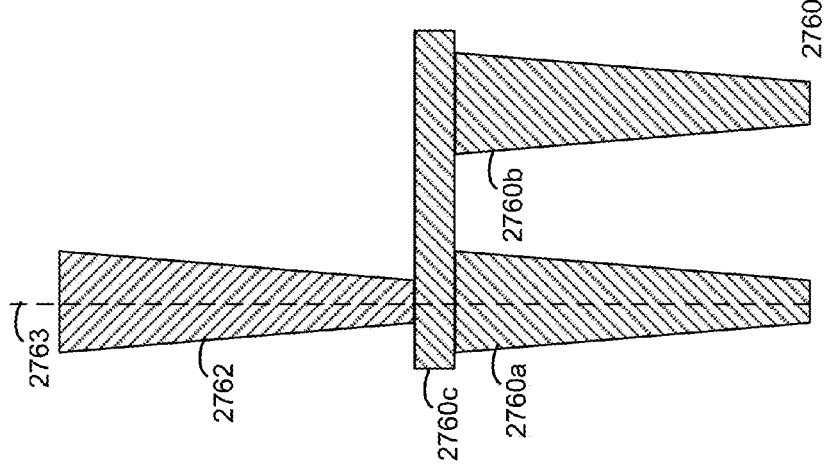
FIG. 27G depicts an example of first and second polysilicon columns below a third, metal column, where the first column is directly below (aligned with) the third column.

FIG. 27G depicts an example of first and second polysilicon columns below a third, metal column, where the first column is directly below (aligned with) the third column. A horizontally extending polysilicon region 2760c contacts a top of a first polysilicon column 2760a and a top of a second polysilicon column 2760b. A third column 2762 has a common central vertical axis 2763 with the first polysilicon column so that the third column and the first polysilicon column are aligned. The third column does not have a common central vertical axis with the second polysilicon column so that the third column and the second polysilicon column are not aligned. This configuration allows multiple resistor columns to be used with one metal column such as depicted in FIG. 28C, where resistor columns 2812 and 2813 are depicted. The multiple resistor columns may be connected to a common transistor terminal. In this case, the resistors are connected in parallel and the equivalent resistance Req of a resistor 2760 is given by: 1/Req=1/R1+1/R2, where R1 and R2 are the resistances of the first and second polysilicon columns 2760a and 2760b, respectively. This approach therefore provides an equivalent resistance which is less than the resistance of any of the resistors which are connected in parallel. Generally, the number of resistor columns can define a resistance.

FIG. 27H depicts an example of first and second polysilicon columns below a third, metal column, where the first and second columns are not aligned with the third column. A horizontally extending polysilicon region 2770c contacts a top of a first polysilicon column 2770a and a top of a second polysilicon column 2770b. A third column 2772 has a central vertical axis 2773 which is not aligned with the first or second polysilicon columns. This configuration allows multiple resistor columns to be used, as a resistor 2770, with one metal column such as depicted in FIG. 28C, where resistor columns 2812 and 2813 are depicted. This configuration shows a flexibility in the positioning of the columns.

In FIG. 27G, the column 2760b is an example of an additional column in the peripheral area, where the additional column extends from a terminal of a transistor on the substrate to the height of the top of the first tier. The column 2762 is an example of a second column which is electrically connected to the additional column. The column 2760a is an example of a first column. The column 2762 is also electrically connected to the first column 2760a.

FIG. 27I depicts an example of a first polysilicon column below a second, metal column, where the first and second columns are not aligned with one another. A horizontally extending polysilicon region 2870b contacts a top of a polysilicon column 2870a. A second column 2872 has a central vertical axis 2873 which is not aligned with the first column. This configuration also shows a flexibility in the positioning of the columns.

FIG. 28A depicts a close-up view of an example transistor in the peripheral region of FIG. 11 in which columnar resistors are connected to terminals of the transistor. A semiconductor structure 2800 includes a dielectric 2801 above a transistor layer 2802, which in turn is above a substrate 2803.

An example transistor 2820 is a MOSFET. The substrate includes n or p type diffusion regions 2821 and 2822 which act as source/drain terminals of the transistor. For example, the diffusion region 2822 may be the source terminal and the diffusion region 2821 may be the drain terminal. The transistor also includes a control gate 2824 (e.g., doped polysilicon) and a gate oxide 2825. When an appropriate voltage is applied to the control gate, a conductive channel is formed in the substrate under the gate oxide between the source and drain terminals. A conductive etch stop layer 2823 is provided above the control gate. A silicon nitride layer extends in a blanket deposition on the substrate and over the transistor. The silicon nitride layer includes a portion 2826 on the substrate, a portion 2827 on a sidewall of the transistor and a portion 2828 on a top of the transistor. A sidewall insulation layer 2829 may also be present on the sidewall of the transistor.

The substrate includes shallow trench isolation regions 2804 and 2805 which isolate the transistor from neighboring transistors.

A columnar resistor 2810 extends down though the dielectric and the portion 2828 of the silicon nitride layer to the etch stop layer 2823. A bottom 2810a of the columnar resistor touches the etch stop layer. The etch stop layer may be a conductive material which acts as a contact to the control gate 2824 of the transistor. Or, the etch stop layer 2823 may be omitted, in which case the bottom 2810a of the columnar resistor touches the control gate 2824. Another columnar resistor 2812 extends down though the dielectric, the transistor layer 2802 and the portion 2826 of the silicon nitride layer to the diffusion region 2822 of the substrate. A bottom 2812a of the columnar resistor touches the diffusion region.

This example shows columnar resistors connected to two terminals of a transistor. Generally, one or more columnar resistors can be connected to one or more terminals of a transistor. Another option is for a columnar resistor to be connected to one terminal of a transistor while a columnar metal contact, e.g., a non-resistor column, is connected to another terminal of the transistor. It is also possible for multiple columnar metal contacts to be connected to one terminal of a transistor. The diameter of the resistor pillar can be the same or different than the diameter of the memory hole. Generally, the diameter of the resistor pillar will be on the same order of magnitude as the diameter of the memory hole. Further, the shape of the resistor pillar can be a circle, square, ellipse, rectangle or line, for instance. Various other transistor and columnar resistor configurations may be provided.

FIG. 28B depicts an example cross-sectional view along line 2850 in FIG. 28A, where one columnar resistor 2810 is connected to one terminal of the transistor (e.g., the control gate 2824) and another columnar resistor is connected to another terminal of the transistor (e.g., the diffusion region 2822 which provides the source terminal). The semiconductor structure 2800 is depicted.

FIG. 28C depicts another example cross-sectional view along line 2850 in FIG. 28A, where one columnar resistor 2810 is connected to one terminal of the transistor (e.g., the control gate 2824) and two columnar resistors 2812 and 2813 are connected to another terminal of the transistor (e.g., the diffusion region 2822 which provides the source terminal). A semiconductor structure 2870 is depicted.

Figure 29:
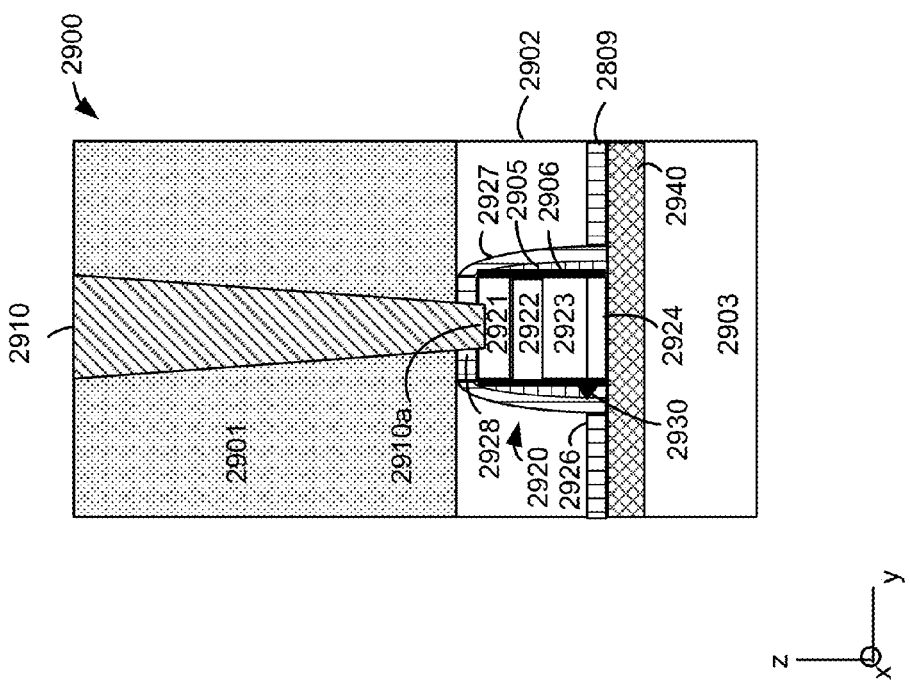
FIG. 29 depicts another example transistor in the peripheral region of FIG. 11 in which columnar resistors are connected to terminals of the transistor.

FIG. 29 depicts another example transistor in the peripheral region of FIG. 11 in which columnar resistors are connected to terminals of the transistor. This example transistor is a vertical channel transistor with dual side control gates. A semiconductor structure 2900 includes a dielectric 2901 above a transistor layer 2902, which in turn is above a substrate 2903.

The transistor 2920 has a body 2930 comprising three regions 2922, 2923 and 2924 such as n+, p– and n+ type silicon regions, respectively, where the top region 2922 is the drain terminal and the bottom region 2924 is the source terminal. A voltage is applied to side control gates to control whether a conductive channel exists between the source and the drain. For example, a control gate 2905 is separated from the body by an oxide region 2906. A silicon nitride layer includes a portion 2926 on the substrate, a portion 2927 on a sidewall of the transistor and a portion 2928 on a top of the transistor. A conductive line 2940 such as metal extends below the transistor and is in contact with the source region 2924 of the transistor. If a conductive channel exists between the source and the drain, a voltage on the conductive line is passed to the drain terminal.

A columnar resistor 2910 extends down though the dielectric and the portion 2928 of the silicon nitride layer to a etch stop layer 2921. A bottom 2910a of the columnar resistor touches the etch stop layer. The etch stop layer may be a conductive material which acts as a contact to the drain 2922 of the transistor. Or, the etch stop layer may be omitted, in which case the bottom 2910a of the columnar resistor touches the drain 2922.

Accordingly, it can be seen that, in one embodiment, a semiconductor device comprises: a substrate; a stack in a memory cell area of the substrate, the stack comprising a first tier and a second tier on the first tier, the first tier comprising a first set of alternating control gate layers and dielectric layers and the second tier comprising a second set of alternating control gate layers and dielectric layers, the stack comprising memory holes, each memory hole comprises a portion in the first tier and a portion in the second tier, and memory films extend along a wall of each memory hole; a transistor formed on the substrate in a peripheral area, peripheral to the memory cell area, the transistor is in a circuit; a first column in the peripheral area, the first column comprises polysilicon, a resistor in the circuit comprises the polysilicon in the first column, and the first column extends from a terminal of the transistor to a height of a top of the first tier; and a second column which extends from the height of the top of the first tier to a height of a top of the second tier, the second column is electrically connected to the first column.

In another embodiment, a method for fabricating a memory device comprises: forming a first tier of a stack in a memory cell area of a substrate, the first tier of the stack comprising a first set of alternating control gate layers and dielectric layers; forming vertical holes in the first tier of the stack; providing a sacrificial material in the vertical holes in the first tier of the stack; forming a first vertical hole in a dielectric peripheral area, the dielectric peripheral area is on the substrate and peripheral to the memory cell area; providing polysilicon in the first vertical hole; forming a second tier of the stack on the first tier of the stack, the second tier of the stack comprising a second set of alternating control gate layers and dielectric layers; forming vertical holes in the second tier of the stack, aligned with the sacrificial material in the vertical holes in the first tier; removing the sacrificial material from the vertical holes in the first tier; providing memory films in the vertical holes in the second tier and the vertical holes in the first tier; forming a second vertical hole in the dielectric peripheral area, above the first vertical hole; and providing a conductive material in the second vertical hole, the conductive material is electrically connected to the polysilicon.

In another embodiment, a semiconductor device comprises: a substrate; a transistor formed on the substrate, the transistor is in a circuit; a doped polysilicon column which is a resistor in the circuit, the doped polysilicon column is tapered, becoming narrower at a bottom of the doped polysilicon column; and a metal column which is above the doped polysilicon column, wherein a bottom of the doped polysilicon column contacts a terminal of the transistor, a bottom of the metal column is on a top of the doped polysilicon column, and the metal column is tapered, becoming narrower at a bottom of the metal column.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. A semiconductor device, comprising:
    a substrate;
    a stack in a memory cell area of the substrate, the stack comprising a first tier and a second tier on the first tier, the first tier comprising a first set of alternating control gate layers and dielectric layers and the second tier comprising a second set of alternating control gate layers and dielectric layers, the stack comprising memory holes, each memory hole comprises a portion in the first tier and a portion in the second tier, and memory films extend along a wall of each memory hole;
    a transistor formed on the substrate in a peripheral area, peripheral to the memory cell area, the transistor is in a circuit;
    a first column in the peripheral area, the first column comprises polysilicon and extends from a terminal of the transistor to a height of a top of the first tier, wherein a doping concentration of the first column decreases progressively moving downward from a top of the first column; and a second column which extends from the height of the top of the first tier to a height of a top of the second tier, the second column is electrically connected to the first column.

2. The semiconductor device of claim 1, wherein:
the second column comprises a metal pillar; and
a top surface of the first column touches a bottom surface of the metal pillar.

3. The semiconductor device of claim 2, wherein:
a top surface of the first column provides an ohmic contact to the metal pillar.

4. The semiconductor device of claim 1, wherein:
the first column comprises ion implanted at different depths and different doping concentrations.

5. The semiconductor device of claim 1, further comprising:
a resistor in the circuit, the resistor comprising the first column.

6. The semiconductor device of claim 1, wherein:
the second column comprises metal; and
a top surface of the first column touches a bottom surface of the metal.

7. The semiconductor device of claim 1, wherein:
the first column comprises at least three regions with different doping concentrations.

8. The semiconductor device of claim 1, wherein:
a doping concentration of the top of the first column is about 1E19-22/cm3.

9. The semiconductor device of claim 1, wherein:
at least a bottom portion of the second column comprises polysilicon; and
a resistor in the circuit comprises the polysilicon in the at least the bottom portion of the second column.

10. The semiconductor device of claim 1, wherein:
the second column comprises polysilicon; and
a doping concentration of the polysilicon in the second column is different than a doping concentration of the polysilicon in the first column by at least an order of magnitude.

11. The semiconductor device of claim 1, wherein:
a bottom of the first column is in contact with an n or p type diffusion region of the transistor in the substrate.

12. The semiconductor device of claim 1, wherein:
a bottom of the first column is in contact with a control gate of the transistor.

13. The semiconductor device of claim 1, wherein:
the first column is tapered, becoming narrower at a bottom of the first column;
the second column is tapered, becoming narrower at a bottom of the second column; and
a top of the first column is wider than a bottom of the second column.

14. The semiconductor device of claim 1, wherein:
the first column extends through a silicon nitride layer to the terminal of the transistor.

* * * * *